(12) United States Patent
Schaeffer et al.

(10) Patent No.: US 10,410,911 B2
(45) Date of Patent: Sep. 10, 2019

(54) BURIED INSULATOR REGIONS AND METHODS OF FORMATION THEREOF

(71) Applicant: Infineon Technologies AG, Neubiberg (DE)

(72) Inventors: Carsten Schaeffer, Annenheim (AT); Andreas Moser, Maria-Rain (AT); Matthias Kuenle, Villach (AT); Matteo Dainese, Villach (AT); Roland Rupp, Lauf (DE); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 12 days.

(21) Appl. No.: 15/833,781

(22) Filed: Dec. 6, 2017

(65) Prior Publication Data
US 2018/0166324 A1    Jun. 14, 2018

(30) Foreign Application Priority Data
Dec. 13, 2016    (DE) ........................ 10 2016 124 207

(51) Int. Cl.
*H01L 21/76* (2006.01)
*H01L 21/762* (2006.01)
(Continued)

(52) U.S. Cl.
CPC .. *H01L 21/76248* (2013.01); *H01L 21/02532* (2013.01); *H01L 21/02592* (2013.01); *H01L 21/02595* (2013.01); *H01L 21/02647* (2013.01); *H01L 21/02667* (2013.01); *H01L 21/26513* (2013.01); *H01L 21/3065* (2013.01); *H01L 21/3083* (2013.01); *H01L 21/30604* (2013.01);
(Continued)

(58) Field of Classification Search
CPC ............................. H01L 29/10; H01L 21/762
See application file for complete search history.

(56) References Cited

U.S. PATENT DOCUMENTS

| | | |
|---|---|---|
| 4,760,036 A | 7/1988 | Schubert |
| 4,889,829 A | 12/1989 | Kawai |

(Continued)

FOREIGN PATENT DOCUMENTS

DE    102012103369 A1    10/2012

OTHER PUBLICATIONS

Zytkiewicz, Z.R., "Laterally overgrown structures as substrates for lattice mismatched epitaxy", Thin Solid Films 412 (2002), pp. 64-75.

(Continued)

*Primary Examiner* — Caridad Everhart
*Assistant Examiner* — Ankush K Singal
(74) *Attorney, Agent, or Firm* — Slater Matsil, LLP

(57) ABSTRACT

A method of fabricating a semiconductor device includes forming a buried insulation region within a substrate by processing the substrate using etching and deposition processes. A semiconductor layer is formed over the buried insulation region at a first side of the substrate. Device regions are formed in the semiconductor layer. The substrate is thinned from a second side of the substrate to expose the buried insulation region. The buried insulation region is selectively removed to expose a bottom surface of the substrate. A conductive region is formed under the bottom surface of the substrate.

16 Claims, 22 Drawing Sheets

(51) Int. Cl.
*H01L 21/02* (2006.01)
*H01L 21/265* (2006.01)
*H01L 21/306* (2006.01)
*H01L 21/3065* (2006.01)
*H01L 29/06* (2006.01)
*H01L 29/08* (2006.01)
*H01L 29/10* (2006.01)
*H01L 29/66* (2006.01)
*H01L 29/78* (2006.01)
*H01L 21/308* (2006.01)
*H01L 29/739* (2006.01)
*H01L 21/8234* (2006.01)
*H01L 27/12* (2006.01)
*H01L 27/088* (2006.01)

(52) U.S. Cl.
CPC ...... *H01L 21/30625* (2013.01); *H01L 21/762* (2013.01); *H01L 21/823481* (2013.01); *H01L 21/823487* (2013.01); *H01L 27/1207* (2013.01); *H01L 29/06* (2013.01); *H01L 29/0649* (2013.01); *H01L 29/08* (2013.01); *H01L 29/0804* (2013.01); *H01L 29/0865* (2013.01); *H01L 29/0882* (2013.01); *H01L 29/10* (2013.01); *H01L 29/1095* (2013.01); *H01L 29/66* (2013.01); *H01L 29/66333* (2013.01); *H01L 29/66348* (2013.01); *H01L 29/66712* (2013.01); *H01L 29/66734* (2013.01); *H01L 29/7393* (2013.01); *H01L 29/7812* (2013.01); *H01L 21/02238* (2013.01); *H01L 21/02255* (2013.01); *H01L 27/088* (2013.01); *H01L 29/7395* (2013.01); *H01L 29/7397* (2013.01); *H01L 29/7813* (2013.01)

(56) References Cited

U.S. PATENT DOCUMENTS

| | | |
|---|---|---|
| 5,710,057 A | 1/1998 | Kenney |
| 6,551,944 B1 | 4/2003 | Fallica et al. |
| 6,670,257 B1 | 12/2003 | Barlocchi et al. |
| 6,940,098 B1 | 9/2005 | Tadatomo et al. |
| 7,557,002 B2 | 7/2009 | Wells et al. |
| 7,888,201 B2 | 2/2011 | Yeo et al. |
| 8,008,170 B2 | 8/2011 | Liang et al. |
| 8,334,188 B2 | 12/2012 | Villa et al. |
| 8,574,968 B2 | 11/2013 | Arena et al. |
| 8,598,713 B2 | 12/2013 | Blaschke et al. |
| 9,064,742 B2 * | 6/2015 | Tamura ............ H01L 27/1207 |
| 9,214,378 B2 * | 12/2015 | Cheng ................ H01L 21/84 |
| 2002/0001965 A1 | 1/2002 | Forbes |
| 2002/0094663 A1 | 7/2002 | Kwon et al. |
| 2010/0038745 A1 * | 2/2010 | Wu ................ H01L 21/76232 |
| | | 257/510 |
| 2011/0101452 A1 | 5/2011 | Sonsky et al. |
| 2011/0147883 A1 | 6/2011 | Schulze et al. |
| 2012/0264259 A1 | 10/2012 | Hirler et al. |
| 2013/0228876 A1 | 9/2013 | Mor et al. |
| 2013/0299950 A1 | 11/2013 | Hummler |

OTHER PUBLICATIONS

Shareef, I.A., et al., "Subatmospheric chemical vapor deposition ozone/TEOS process for SiO2 trench tilling", J. Vac. Sci. Technol. B, vol. 13, No. 4, Jul./Aug. 1995, pp. 1888-1892.

Kim, Min-Soo, et al., "In-situ Monitoring of Anodic Oxidation of p-type Si(100) by Electrochemical Impedance Techniques in Nonaqueous and Aqueous Solutions", Bull. Korean Chem. Soc. 1999, vol. 20, No. 9, pp. 1049-1055.

Grant, Nicholas E, "Low temperate anodically grown silicon dioxide films for solar cell applications", Australian National University, Centre for Sustainable Energy Systems, May 9, 2013.

Wikipedia Contributors, "Silicon on insulator", Wikipedia, The Free Encyclopedia, Date of last revision Nov. 23, 2016.

* cited by examiner

BURIED INSULATOR REGIONS AND METHODS OF FORMATION THEREOF

CROSS-REFERENCE TO RELATED APPLICATIONS

This application claims the benefit of DE Application No. 102016124207.1 filed on Dec. 13, 2016, which application is hereby incorporated herein by reference.

TECHNICAL FIELD

The present invention relates generally to semiconductor processing, and, in particular embodiments, to substrates with buried insulation regions and methods of formation thereof.

BACKGROUND

Semiconductor devices are used in a variety of electronic and other applications. Semiconductor devices comprise, among other things, integrated circuits or discrete devices that are formed on semiconductor wafers by depositing and patterning one or more types of thin films of material over the semiconductor wafers. Bulk semiconductor wafers are fabricated using floating zone (FZ) or magnetic Czochralski (MCz) techniques, or by other processes.

A particularly useful structure in semiconductor devices is a buried oxide region within the semiconductor substrate. Buried oxide regions are commonly formed in bulk semiconductor wafers using a separation by implantation of oxygen (SIMOX) process or by wafer bonding to create silicon-on-insulator (SOI) wafers. Consequently, SOI wafers have higher manufacturing costs and limited supply compared to bulk semiconductor wafers.

SUMMARY

In accordance with an embodiment of the invention, a method of fabricating a semiconductor device includes forming a buried insulation region within a substrate by processing the substrate using etching and deposition processes. A semiconductor layer is formed over the buried insulation region at a first side of the substrate. Device regions are formed in the semiconductor layer. The substrate is thinned from a second side of the substrate to expose the buried insulation region. The buried insulation region is selectively removed to expose a bottom surface of the substrate. A conductive region is formed under the bottom surface of the substrate.

Optionally, forming the device regions may include forming a source region that has a first conductivity type at the first side. A drift region may be formed that has the first conductivity type under the source region. A well region may be formed separating the source region from the drift region. The well region may have a second conductivity type opposite to the first conductivity type. The method of fabricating a semiconductor device may also include implanting dopants into the bottom surface and activating the implanted dopants to form at least one of a drain region or a back side emitter after selectively removing the buried insulation region.

Optionally, forming the buried insulation region may include forming a plurality of balloon shaped regions connected by thinner regions.

Optionally, forming the buried insulation region may include forming a plurality of openings in a semiconductor substrate using an isotropic etching process. An oxide may be formed within the plurality of openings. The forming of the oxide may include converting regions of the semiconductor substrate between adjacent ones of the plurality of openings into the oxide. Forming the plurality of openings may include forming a plurality of first openings using a first anisotropic etching process. A passivation layer may be formed at sidewalls and bottom surfaces of the plurality of first openings. A plurality of second openings may be formed in the semiconductor substrate using a second anisotropic etching process. The second anisotropic etching process may include etching through the passivation layer at the bottom surfaces of the plurality of first openings. The plurality of openings may be formed by extending through the plurality of second openings using an isotropic etching process.

Optionally, forming the semiconductor layer includes forming a first epitaxial layer. Forming the first epitaxial layer may include forming an epitaxial overgrowth layer using a lateral epitaxial overgrowth process. The epitaxial overgrowth layer may cover the buried insulation region. The method of fabricating a semiconductor device may also include forming a second epitaxial layer over the epitaxial overgrowth layer. The device regions may be formed in the second epitaxial layer. The device regions may include a source and a p-body region of a transistor.

Optionally, forming the semiconductor layer may include depositing a semiconductor fill material and annealing the semiconductor layer and the substrate. The deposited semiconductor fill material may be planarized. The semiconductor fill material may include an amorphous material. Alternatively, the semiconductor fill material may include polysilicon material. The semiconductor layer may cover the buried insulation region.

In accordance with another embodiment of the invention, a method of fabricating a semiconductor device includes forming a plurality of first openings and pillars in a substrate using a first etching process. Each of the plurality of first openings is spaced from another one of the plurality of first openings by one of the pillars. A plurality of second openings is formed within the plurality of first openings in the substrate using a second etching process. A plurality of third openings is formed in the substrate by exposing the plurality of second openings to an isotropic etching process. A plurality of oxide regions is formed at the plurality of third openings to form a continuous region. A semiconductor layer is formed over the continuous region. A device region of a vertical semiconductor device is formed in the semiconductor layer.

Optionally, forming the semiconductor layer may include forming an epitaxial overgrowth layer from the pillars using a lateral epitaxial overgrowth process. The substrate may be thinned from a second side of the substrate to expose the continuous region. The continuous region may be selectively removed. A conductive region may be formed on the second side of the substrate.

Optionally, the plurality of first openings may be arranged in a periodic pattern of rectangles. Each of the rectangles in the periodic pattern of rectangles may include a width and a length. The length may extend from an edge of a die region of the substrate to an opposing edge of the die region of the substrate.

Optionally, an area between the each of the plurality of first openings may be arranged in a periodic pattern of rectangles. Each of the rectangles in the periodic pattern of rectangles may include a width and a length. The periodic pattern of rectangles may also include a plurality of rows of rectangles. Each of the rectangles in each of the plurality of rows of rectangles may be aligned with each of the rectangles in adjacent rows. Alternatively, each of the rectangles in each of the plurality of rows of rectangles may be staggered relative to each of the rectangles in adjacent rows.

Optionally, a method of fabricating a semiconductor device may also include forming a doped region in the substrate before forming the plurality of first openings. The plurality of first openings, the plurality of second openings, and the plurality of third openings may be formed in the doped region. A lateral rate of growth of the plurality of oxide regions may be greater than a vertical rate of growth of the plurality of oxide regions during the forming of the plurality of oxide regions.

Optionally, forming the semiconductor layer may include forming a layer including a semiconductor material over the pillars and the substrate. The layer including the semiconductor material may fill the plurality of first openings and may cover the continuous region. The layer including the semiconductor material and the substrate may be annealed to form a single crystal layer. The layer comprising the semiconductor material may be amorphous.

In accordance with still another embodiment of the invention, a method of fabricating a semiconductor device includes forming a buried insulation region within a substrate by processing the substrate using etching and deposition processes. The substrate includes a first region and a second region. The buried insulation region is formed locally in the first region of the substrate. An epitaxial layer is formed over the buried insulation region at a first side of the substrate. The epitaxial layer is formed in both the first region and the second region. A first device is formed in the first region and a second device is formed in the second region in the epitaxial layer. The substrate is thinned from a second side of the substrate to expose the buried insulation region. A conductive region is formed under a bottom surface of the substrate. The conductive region is a back side contact of the second device and is isolated from the first device by the buried insulation region.

Optionally, the first device may be a lateral transistor. The second device may be a vertical transistor. The method of fabricating a semiconductor device may also include removing the buried insulation region to form a cavity under the substrate. The conductive region may be formed within the cavity. The cavity may be directly under an active device region formed in the epitaxial layer or under a gate region formed over the epitaxial layer. The conductive region may be isolated from the first device by the buried insulation region.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1K illustrate an embodiment of fabricating a semiconductor substrate comprising a buried oxide region in accordance with embodiments of the invention, wherein FIG. 1A illustrates a cross-sectional view of a semiconductor substrate after forming a first mask over the semiconductor substrate, wherein FIG. 1B illustrates a cross-sectional view of the semiconductor substrate after forming trenches in the semiconductor substrate, wherein FIG. 1C illustrates a cross-sectional view of the semiconductor substrate after forming a second mask over the trenches, the first mask, and the semiconductor substrate, wherein FIG. 1D illustrates a cross-sectional view of the semiconductor substrate after forming deep trenches in the semiconductor substrate, wherein FIG. 1E illustrates a cross-sectional view of the semiconductor substrates after forming enlarged regions in the deep trenches and the semiconductor substrate, wherein FIG. 1F illustrates a cross-sectional view of the semiconductor substrate after forming an oxide region in the deep trenches and the semiconductor substrate, wherein FIG. 1G illustrates a cross-sectional view of the semiconductor substrate after removing the first mask and the second mask, wherein FIG. 1H illustrates a cross-sectional view of the semiconductor substrate after forming an epitaxial overgrowth layer and void regions over the semiconductor substrate, the deep trenches, and the oxide region, wherein FIG. 1J illustrates a cross-sectional view of the semiconductor substrate after forming an epitaxial layer, and wherein FIG. 1K illustrates a cross-sectional view of the semiconductor substrate after optionally smoothing the epitaxial layer;

FIGS. 2A-2E illustrate an alternative embodiment of fabricating a semiconductor substrate comprising an oxide region in accordance with embodiments of the invention, wherein FIG. 2A illustrates a cross-sectional view of a semiconductor substrate comprising an optional doped region and a first mask after forming trenches in the semiconductor substrate and an optional doped region, wherein FIG. 2B illustrates a cross-sectional view of the semiconductor substrate after forming a second mask over the trenches, the first mask, and the optional doped region, wherein FIG. 2C illustrates a cross-sectional view of the semiconductor substrate after forming deep trenches in the optional doped region, wherein FIG. 2D illustrates a cross-sectional view of the semiconductor substrate after forming enlarged regions in the deep trenches, the optional doped region, and the semiconductor substrate, and wherein FIG. 2E illustrates a cross-sectional view of the semiconductor substrate after forming an oxide region in the deep trenches, the optional doped region, and the semiconductor substrate;

FIGS. 3A-3E illustrate another alternative embodiment of fabricating a semiconductor substrate comprising a buried oxide region in accordance with embodiments of the invention, wherein FIG. 3A illustrates a semiconductor substrate comprising a first mask, a second mask, and deep trenches after forming an oxide region in the semiconductor substrate and the deep trenches, wherein FIG. 3B illustrates the semiconductor substrate after removing the first mask and the second mask, wherein FIG. 3C illustrates the semiconductor substrate after forming a semiconductor layer over the semiconductor substrate and in the deep trenches, wherein FIG. 3D illustrates the semiconductor substrate after smoothing a top surface of semiconductor layer, and wherein FIG. 3E illustrates the semiconductor substrate after annealing the semiconductor substrate and the semiconductor layer to form an annealed region;

FIGS. 4A-4E illustrate several embodiments of a semiconductor substrate after forming a first mask over the semiconductor substrate in accordance with embodiments of the invention, wherein FIG. 4A illustrates an embodiment of the top view of the semiconductor substrate after forming the first mask over the semiconductor substrate, wherein FIG. 4B illustrates an alternative embodiment of the top view of the semiconductor substrate after forming the first mask over the semiconductor substrate, wherein FIG. 4C illustrates another alternative embodiment of the top view of the semiconductor substrate after forming the first mask over the semiconductor substrate, wherein FIG. 4D illustrates yet another alternative embodiment of the top view of the semiconductor substrate after forming the first mask over the semiconductor substrate, and wherein FIG. 4E illustrates various embodiments of the top view of the semiconductor substrate after forming the first mask over the semiconductor substrate;

FIGS. 5A-5B illustrate embodiments of a semiconductor substrate that has a bulk semiconductor region comprising a buried oxide region in accordance with embodiments of the invention, wherein FIG. 5A illustrates an embodiment of a cross-sectional view of the semiconductor substrate that has a bulk semiconductor region after forming an oxide region, and wherein FIG. 5B illustrates an alternative embodiment of a cross-sectional view of the semiconductor substrate that has a bulk semiconductor region after forming the oxide region;

FIG. 6A-6H illustrate an embodiment of fabricating a semiconductor device from a semiconductor substrate comprising a buried oxide region in accordance with embodiments of the invention, wherein FIG. 6A illustrates a cross-sectional view of the semiconductor device after forming a well region in an epitaxial layer of the semiconductor substrate comprising the buried oxide region and subsequently forming a doped region in the well region, wherein FIG. 6B illustrates a cross-sectional view of the semiconductor device after forming gate dielectric regions and gate regions over the epitaxial layer, the well region, and the doped region and subsequently forming an insulating region over the gate regions and doped region, wherein FIG. 6C illustrates a cross-sectional view of the semiconductor device after forming a top contact, wherein FIG. 6D illustrates a cross-sectional view of the semiconductor device after thinning the semiconductor substrate, wherein FIG. 6E illustrates a cross-sectional view of the semiconductor device after removing the oxide region, wherein FIG. 6F illustrates a cross-sectional view of the semiconductor device after smoothing the bottom of the semiconductor substrate and the epitaxial layer, wherein FIG. 6G illustrates a cross-sectional view of the semiconductor device after forming an optional implantation region in the semiconductor substrate and the epitaxial layer, and wherein FIG. 6H illustrates a cross-sectional view of the semiconductor device after forming a bottom contact and subsequently coupling a gate connection, a top connection, and a bottom connection to one or more of the gate regions, the top contact, and the bottom contact respectively;

FIGS. 7A-7C illustrate an embodiment of fabricating a semiconductor device from a semiconductor substrate that has a bulk semiconductor region comprising a buried oxide region in accordance with embodiments of the invention, wherein FIG. 7A illustrates a cross-sectional view of the semiconductor device after forming a well region, a doped region, gate dielectric regions, gate regions, and an insulation region, and subsequently forming a top contact, wherein FIG. 7B illustrates a cross-sectional view of the semiconductor device after thinning the semiconductor substrate, and wherein FIG. 7C illustrates a cross-sectional view of the semiconductor device after removing an oxide region, forming an optional implantation region, filling the void vacated by the oxide region to form a bottom contact, and subsequently coupling a gate connection, a top connection, and a bottom connection to one or more of the gate regions, the top contact, and the bottom contact respectively; and FIGS. 8A and 8B illustrate an embodiment of fabricating semiconductor devices from a semiconductor substrate that has a bulk semiconductor region comprising a buried oxide region in accordance with embodiments of the invention, wherein FIG. 8A illustrates a cross-sectional view of the semiconductor substrate after forming a well region, doped regions, an isolating trench, gate dielectric regions, gate regions, and an insulation region, and wherein FIG. 8B illustrates a cross-sectional view of the semiconductor substrate after forming top contacts, thinning the semiconductor substrate, forming an optional implantation region and bottom contact, and subsequently coupling a gate connection, top connection, a bottom connection, a second gate connection, a source connection, and a drain connection to one or more gate regions, top contacts, and bottom contacts.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Among other uses, buried oxide regions may be used as a reliable etch stop, especially when thinning a semiconductor substrate. However, the manufacturing cost and complexity of fabricating silicon-on-insulator (SOI) wafers is prohibitive in many instances.

Various embodiments of the invention provided below describe various methods of forming semiconductor substrates with buried oxide regions that have advantages over conventional SOI wafers. The following description describes the various embodiments. An embodiment for fabricating a semiconductor substrate comprising a buried oxide region will be described using FIG. 1. An alternative embodiment for fabricating a semiconductor substrate comprising a buried oxide region will be described using FIG. 2. Still another alternative embodiment for fabricating a semiconductor substrate comprising a buried oxide region will be described using FIG. 3. Various embodiments of forming a mask over a semiconductor substrate will be described using FIG. 4. Embodiments of a semiconductor substrate that has a bulk semiconductor region comprising a buried oxide region will be described using FIG. 5. An embodiment for fabricating a semiconductor device from a semiconductor substrate comprising a buried oxide region will be described using FIG. 6. An alternative embodiment for fabricating a semiconductor device from a semiconductor substrate comprising a buried oxide region will be described using FIG. 7. An embodiment for fabricating semiconductor devices from a semiconductor substrate comprising a buried oxide region will be described using FIG. 8.

FIGS. 1A-1K illustrate an embodiment of fabricating a semiconductor substrate comprising a buried oxide region in accordance with embodiments of the invention.

Figure 1A:
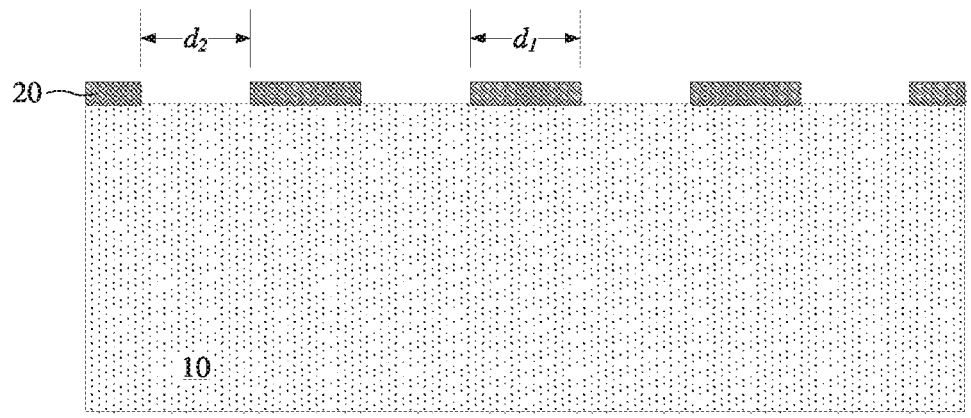

FIG. 1A illustrates a cross-sectional view of a semiconductor substrate after forming a first mask over the semiconductor substrate.

Referring to FIG. 1A, a first mask 20 is formed over a semiconductor substrate 10. The semiconductor substrate 20 is a bulk semiconductor substrate in various embodiments. The semiconductor substrate 10 may be formed using a floating zone (FZ) process, a Czochralski (Cz) process, a magnetic Czochralski process or other suitable process. The semiconductor substrate 10 may be a semiconductor wafer of any size. A possible advantage of the fabrication processes discussed herein may be to fabricate high quality substrates using large diameter wafers of a lower quality. In various embodiments, the semiconductor substrate is a bulk silicon wafer with a diameter greater than or equal to 300 mm. In various embodiments, the semiconductor substrate 10 may be a silicon substrate, germanium substrate or may be a compound semiconductor substrate including indium antimonide, indium arsenide, indium phosphide, gallium nitride, gallium antimonide, gallium arsenide, silicon carbide, or combinations thereof.

In various embodiments, the semiconductor substrate 10 is a silicon substrate, for example, a silicon wafer. In an alternative embodiment, the semiconductor substrate 10 includes a doped epitaxial layer on top. The first mask 20 may be a deposited or grown insulating material that is subsequently patterned or structured in various embodiments. The first mask 20 may be a hard mask material that is used as an etch mask for subsequent plasma etching of the semiconductor substrate 10. Alternatively, a resist mask may be used for plasma etching of the semiconductor substrate 10. The first mask 20 may be formed using one or more processes including a thermal oxidation process, a thermal nitridation process, or a chemical vapor deposition (CVD) process such as low-pressure CVD (LPCVD) or plasma-enhanced CVD (PECVD), or spin-on processes. In various embodiments, the first mask 20 comprises an oxide or a nitride. In one embodiment, the first mask 20 comprises silicon nitride ($Si_3N_4$). In one embodiment, the first mask 20 comprises an oxide layer followed by a nitride layer. In other embodiments, the first mask 20 comprises other combinations of oxide layers and nitride layers such as an oxide layer, a nitride layer, and an oxide layer. In various embodiments, the oxide layer has a thickness that varies between 25 nm and 75 nm and the nitride layer has a thickness that varies between 100 nm and 500 nm. In one embodiment, the thickness of the oxide layer is about 50 nm and the thickness of the nitride layer is about 200 nm.

In various embodiments, the first mask 20 is patterned using lithography techniques. Features of the first mask 20 may expose a surface of the semiconductor substrate 10 and may be periodic with a feature width $d_1$ and a feature pitch $d_2$. In one embodiment, the ratio of the feature width ($d_1$) to the feature pitch ($d_2$) (i.e., $d_1:d_2$) is about 1:1. In various embodiments, the ratio $d_1:d_2$ ranges from 1:2 to 2:1. In various embodiments, the feature width $d_1$ may vary between 250 nm and 500 nm. In one embodiment, the feature width $d_1$ is about 300 nm. In another embodiment, the feature width $d_1$ is about 350 nm.

Figure 1B:
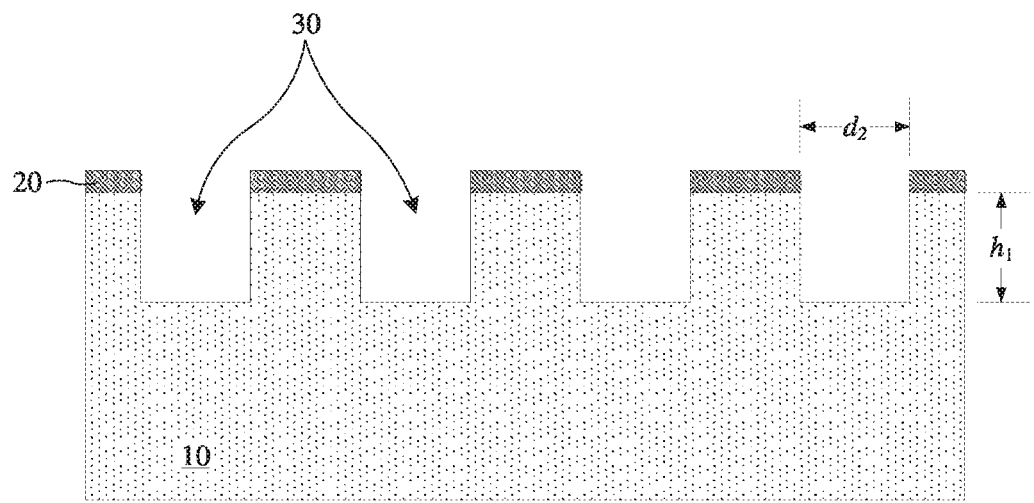

FIG. 1B illustrates a cross-sectional view of the semiconductor substrate after forming trenches in the semiconductor substrate.

Referring to FIG. 1B, trenches 30 are formed in the semiconductor substrate 10 and located between the features of the first mask 20. The trenches 30 may be formed using an anisotropic etching process such as a plasma etching process, for example. In one embodiment, the trenches 30 are formed using a reactive-ion etching (RIE) process. In another embodiment, the trenches 30 are formed using wet etching chemistry or a laser ablation process.

Because of the first mask 20, the trenches 30 have a trench width $d_2$. Additionally, the trenches 30 have a trench depth $h_1$. The ratio of the trench width to the trench depth $d_2:h_1$ is about 1:3 in one embodiment. In various embodiments, the ratio $d_2:h_1$ varies between 1:1 and 1:5. In various embodiments, the trench depth $h_1$ is between 250 nm and 1.5 μm. In one embodiment, the trench depth $h_1$ is about 1 μm. In an alternative embodiment, the trench depth $h_1$ is about 500 nm. However, the trench depth $h_1$ is not limited to these dimensions and may be greater than or less than the above embodiments.

Figure 1C:
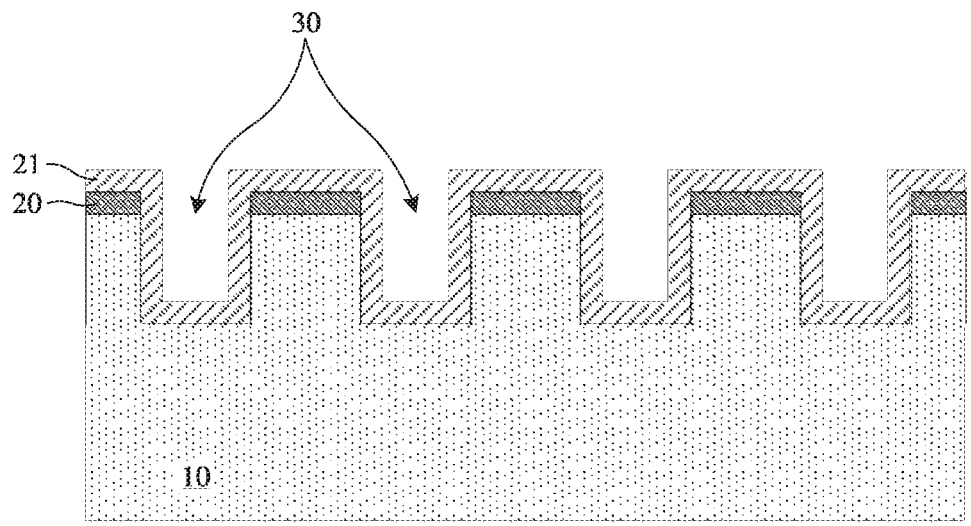
Figure 1D:
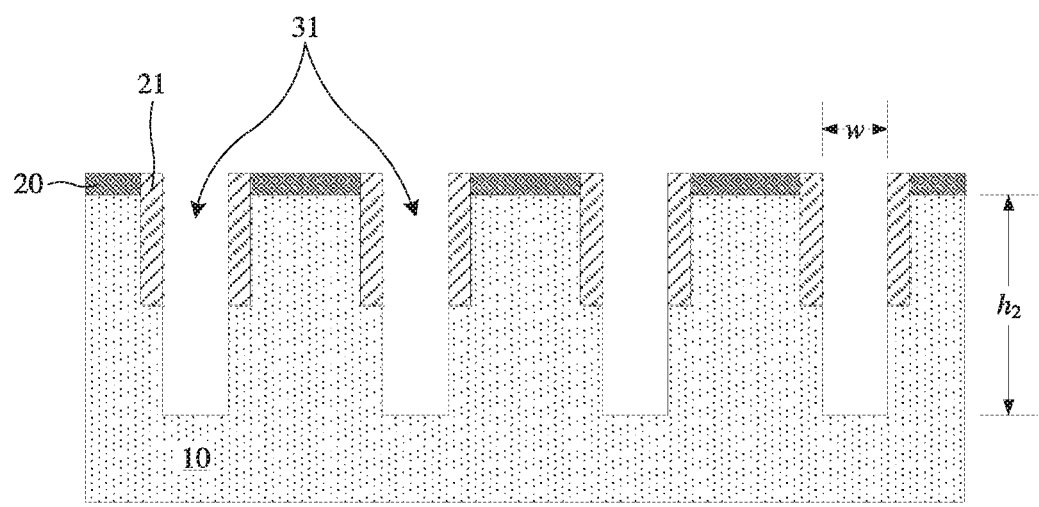

FIG. 1C illustrates a cross-sectional view of the semiconductor substrate after forming a second mask over the trenches, the first mask, and the semiconductor substrate while FIG. 1D illustrates a cross-sectional view of the semiconductor substrate after forming deep trenches in the semiconductor substrate in accordance with embodiments of the invention.

Referring to FIG. 1C, a second mask 21 is formed over the first mask 20, the trenches 30, and the semiconductor substrate 10. The second mask 21 may also cover the sidewalls of the trenches 30. The sidewall portions of the second mask 21 may be used to prevent etching of the covered portions of the trenches 30 in a subsequent etching step. In some embodiments, the first mask 20 may be removed after the formation of the trenches 30 and before the formation of the second mask 21.

Similar to the first mask 20, the second mask 21 may be formed using one or more processes including a thermal oxidation process, a thermal nitridation process, a chemical vapor deposition (CVD) process such as low-pressure CVD (LPCVD) or plasma-enhanced CVD (PECVD), or spin-on processes. However, in contrast to the first mask 20, the second mask 21 is formed after the formation of the trenches 30.

In various embodiments, the second mask 21 is a conformal material. In various embodiments, the second mask 21 comprises a nitride. In one embodiment, the nitride is silicon nitride ($Si_3N_4$). In one embodiment, the second mask 21 may comprise an optional oxide layer followed by a nitride layer. As with the first mask 20, other combinations of layers are also possible. In various embodiments, the optional oxide layer has a thickness that ranges between 1 nm and 40 nm and the nitride layer has a thickness that ranges between 25 nm and 75 nm. In one embodiment, the thickness of the optional oxide layer is 5 nm. In one embodiment, the thickness of the optional oxide layer is about 15 nm and the thickness of the nitride layer is about 50 nm. In some embodiments, the optional oxide layer is omitted.

Referring to FIG. 1D, deep trenches 31 are formed below the trenches 30. The deep trenches 31 may be formed using an anisotropic etching process such that the sidewalls of the second mask 21 on the trenches 30 are maintained after the formation of the deep trenches 31. These sidewalls of the second mask 21 may be considered spacers to prevent subsequent processes to influence the semiconductor substrate 10 in the regions covered by the spacers in a lateral direction. The anisotropic etching process may also remove some or all of the second mask 21 located above the features of the first mask 20 as illustrated in FIG. 1D. The anisotropic etching process may be a plasma etching process, for example. In various embodiments, the deep trenches 31 are formed using a reactive-ion etching (RIE) process or a deep reactive-ion etching (DRIE) process such cryogenic-DRIE or a pulsed etching/deposition process in some embodiments. In an alternative embodiment, the deep trenches 31 are formed using a wet etching chemistry or a laser ablation process.

The deep trenches 31 are high aspect ratio features and extend the depth of the trenches 30 and further to a deep trench depth $h_2$ while maintaining a deep trench width w. The ratio of the deep trench width to the deep trench depth w:$h_2$ is about 1:6 in one embodiment. In various embodiments the ratio w:$h_2$ varies between 1:4 and 1:8. In one embodiment, the deep trench depth $h_2$ is about 2 µm.

Figure 1E:
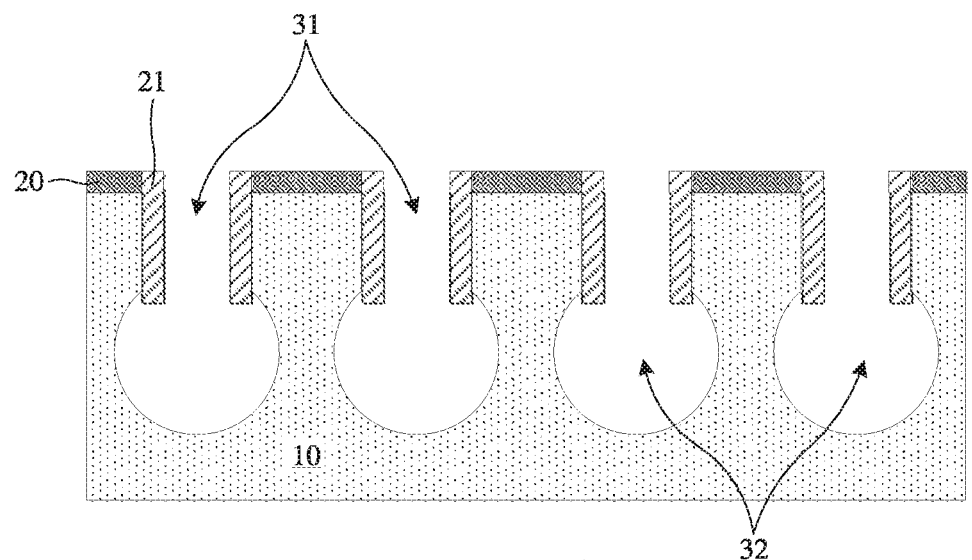

FIG. 1E illustrates a cross-sectional view of the semiconductor substrates after forming enlarged regions in the deep trenches and the semiconductor substrate in accordance with an embodiment of the invention.

Referring to FIG. 1E, enlarged regions 32 are formed in the lower regions of the deep trenches 31. The enlarged regions 32 may be formed using an isotropic etching process. In one embodiment, the isotropic etching process is a wet etching process. The sidewalls of the second mask 21 along with the first mask 20 may prevent the etching of the surfaces covered by the second mask 21 during the formation of the enlarged regions 32. In various embodiments, the enlarged regions 32 have a substantially round shape in the cross-sectional view illustrated in FIG. 1E. In one embodiment, the enlarged regions 32 are substantially circular in the cross-sectional view illustrated in FIG. 1E. In another embodiment, the enlarged regions 32 are substantially ellipsoidal in the cross-sectional view illustrated in FIG. 1E. In alternative embodiments, the formation of the enlarged regions 32 is omitted.

Figure 1F:
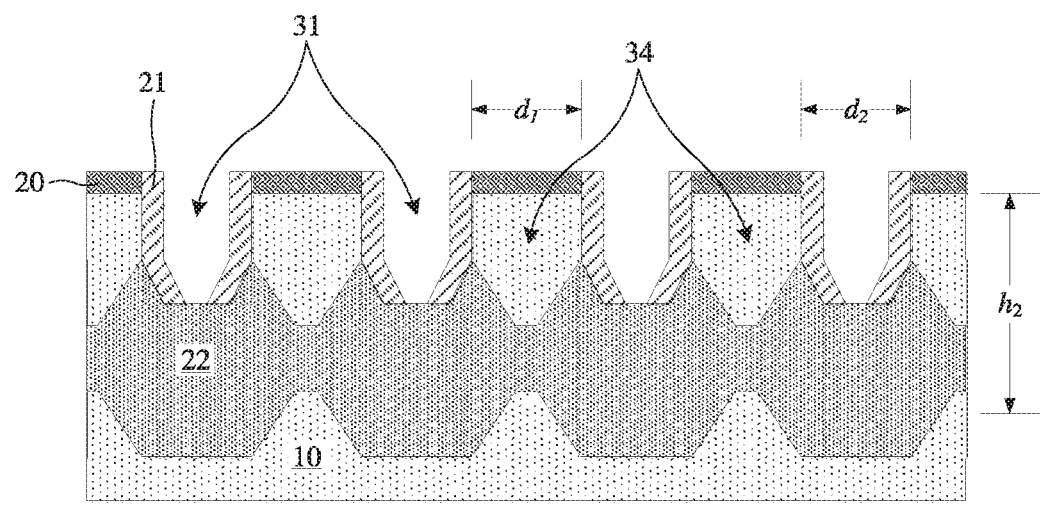

FIG. 1F illustrates a cross-sectional view of the semiconductor substrate after forming an oxide region in the deep trenches and the semiconductor substrate in accordance with an embodiment of the invention.

Referring to FIG. 1F, an oxide region 22 is formed in the deep trenches 31. The oxide region 22 may be formed using a thermal oxidation process such as a local oxidation process. The oxide region 22 may be formed such that the oxide in adjacent deep trenches 31 grows together to form larger oxide regions as illustrated in FIG. 1F. A continuous isolation layer may be formed when the growth front of oxidation from adjacent deep trenches 31 merge together. Thus, the semiconductor regions 34 may become isolated from the semiconductor substrate 10 after the oxidation due to the formation of the continuous isolation layer. This may occur as the semiconductor substrate 10 is consumed by the thermal oxidation process and becomes an oxide. For example, the semiconductor substrate 10 may be a silicon substrate. During formation of the oxide region, the silicon in the semiconductor substrate becomes oxidized and forms silicon dioxide ($SiO_2$). The oxide growth at the surfaces of the semiconductor substrate 10 may proceed inwardly as well as outwardly allowing the oxide from separate deep trenches 31 to meet.

The feature width $d_1$ of the first mask 20, trench width $d_2$ and deep trench depth $h_2$ influence the shape and extents of the oxide region 22. For example, if the feature width $d_1$ is too large, the oxide growth in adjacent deep trenches may be stopped by the second mask 21 before they meet. Similarly, if the deep trench depth $h_2$ is too shallow then the semiconductor regions 34 may be consumed completely.

The maximum usable feature width $d_1$ may also depend on the rate of oxidation in the lateral direction. A higher rate of lateral oxidation may allow for a larger feature width $d_1$. The semiconductor substrate 10 may be engineered to promote lateral oxidative growth by incorporating a high doping concentration in the semiconductor substrate 10. In particular, the top portion of the substrate within the deep trench depth $h_2$ may be doped to concentrations above to $10^{18}$ cm$^{-3}$. In another embodiment, a buried doped layer may be formed by a deep implantation process to dope the top portion of the substrate within the deep trench depth $h_2$ having a peak doping below the trench depth $h_1$. This increased lateral oxidation rate may be particularly notable in the case of incorporating a high concentration of an n-type impurity such as phosphorus into the semiconductor substrate 10.

Another method of increasing the maximum usable feature width $d_1$ may be to form enlarged regions 32 in the deep trenches 31 as described previously in reference to FIG. 1E. The enlarged regions 32 may undercut (expose more of the sidewalls of the second mask 21) the features of the first mask 20 thereby reducing the distance between the sidewalls of adjacent deep trenches 31. Furthermore, the enlarged regions 32 may advantageously facilitate the supply of oxygen to the oxidizing surfaces of the semiconductor substrate 10. Greater oxygen supply during the formation of the oxide region 22 may also increase the rate of oxide formation.

In the example of a silicon semiconductor substrate and silicon dioxide oxide region, the incorporation of two oxygen atoms for every silicon atom into the substrate may locally increase the volume in the regions of oxide growth and cause strain on the film. This may also occur in other combinations of substrate and oxide where the formation of the oxide region consumes the substrate. As previously mentioned, engineering higher rates of lateral oxidation in the semiconductor substrate 10 and utilizing enlarged regions 32 in the deep trenches 31 may allow for larger feature width $d_1$. Consequently, larger feature widths $d_1$ may in turn reduce the tension caused by the oxide formation.

Another possible method of increasing the lateral oxidation rate and also the rate of lateral etching is to introduce a degree of porosity to the semiconductor substrate 10. The semiconductor substrate 10 may be made porous using a controlled etching process. For example, an anodic electrochemical etch using hydrofluoric acid (HF) may be used. This may be done prior to the formation of the enlarged regions 32 to increase the lateral extent of the enlarged regions 32. Alternatively, the porosity may be induced after the formation of enlarged regions 32 and prior to the formation of the oxide region 22.

Figure 1G:
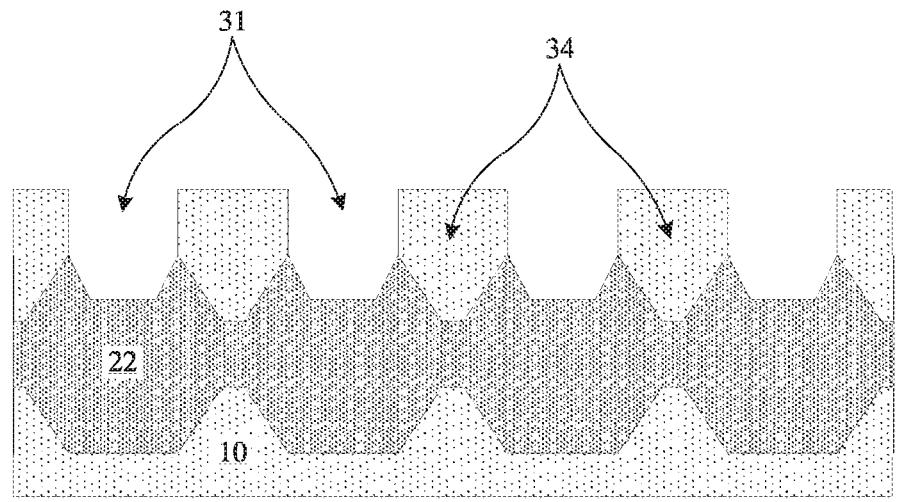

FIG. 1G illustrates a cross-sectional view of the semiconductor substrate after removing the first mask and the second mask in accordance with an embodiment of the invention.

Referring to FIG. 1G, the first mask 20 and the second mask 21 are removed from the semiconductor substrate 10. In various embodiments, the first mask 20 and the second mask 21 are removed using one or more wet etching processes. In one embodiment, phosphoric acid ($H_3PO_4$) is used as a wet etchant. In one embodiment, hydrofluoric acid (HF) is used as a wet etchant. The removal of the first mask 20 and the second mask 21 results in semiconductor regions 34 located above the oxide region 22.

Figure 1H:
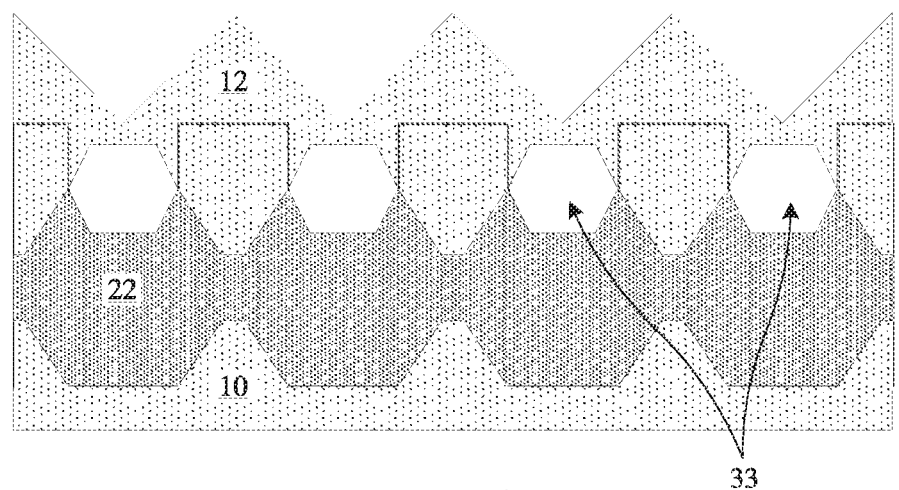

FIG. 1H illustrates a cross-sectional view of the semiconductor substrate after forming an epitaxial overgrowth layer and void regions over the semiconductor substrate, the deep trenches, and the oxide region in accordance with an embodiment of the invention.

Referring to FIG. 1H, an epitaxial overgrowth layer 12 is formed over the semiconductor substrate 10 and the oxide region 22. In one embodiment, the epitaxial overgrowth layer 12 has the same material composition as the semiconductor substrate 10. In various embodiments, void regions 33 form between the epitaxial overgrowth layer 12 and the oxide region 22. The epitaxial overgrowth layer 12 may be formed using an epitaxial overgrowth process. In one embodiment, the epitaxial overgrowth layer 12 forms bridges over the void regions 33 thereby connecting adjacent regions of the semiconductor regions 34. In one embodiment, the epitaxial overgrowth process is a liquid phase epitaxy process. In an alternative embodiment, the epitaxial overgrowth process is a vapor phase epitaxy process.

During, the epitaxial overgrowth process, crystal growth begins at the exposed surfaces of the semiconductor substrate 10 and continues in a direction normal to the exposed surfaces. The individual regions of crystal growth eventually grow together forming larger, continuous regions. The high surface area of the semiconductor regions 34 may advantageously provide nucleation regions for the epitaxial overgrowth process. These nucleation regions may facilitate a uniform orientation of the crystal lattice of the epitaxial overgrowth layer 12 during the epitaxial overgrowth process. In various embodiments, the epitaxial overgrowth layer 12 may be annealed to improve the crystallinity of the epitaxial growth. This may provide advantages for subsequent epitaxial layers such as defect-free, single-crystal growth.

An optional hydrogen annealing may be performed, in some embodiments, to reorient and merge the void regions 33 into fewer larger buried cavities. The hydrogen annealing increases the mobility of silicon atoms and helps to form a higher quality continuous epitaxial layer.

Figure 1J:
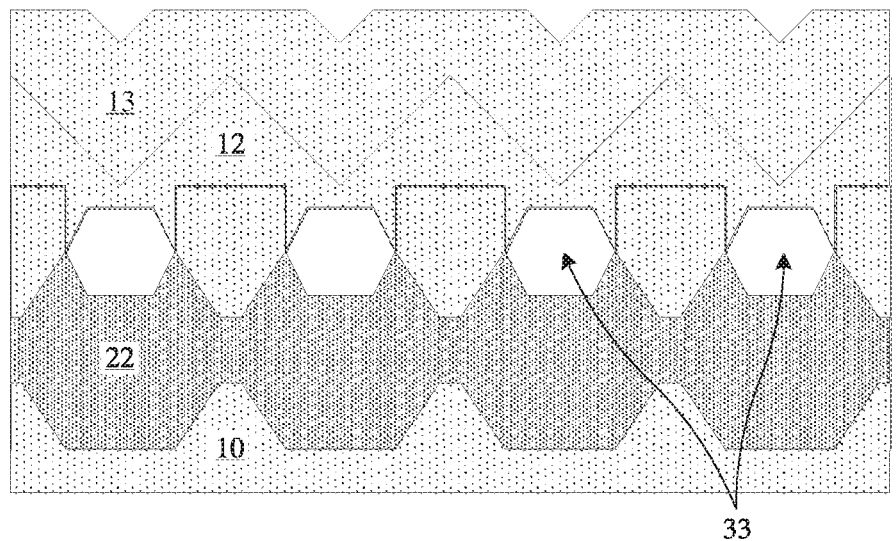

FIG. 1J illustrates a cross-sectional view of the semiconductor substrate after forming an epitaxial layer in accordance with an embodiment of the invention.

Referring to FIG. 1J, an epitaxial layer 13 is formed from the epitaxial overgrowth layer 12 using one or more epitaxial growth steps. The epitaxial layer 13 may be formed using similar methods as those previously described in reference to the epitaxial overgrowth layer 12. The epitaxial layer 13 may comprise multiple epitaxial growth steps with or without annealing steps in between. The one or more epitaxial growth steps may smooth out the initial epitaxial overgrowth layer 12 and provide a defect-free, single-crystal layer for use as a device substrate. Optionally, the epitaxial layer 13 may be formed in a single growth step and the epitaxial overgrowth layer 12 may be omitted.

The thickness of the epitaxial layer 13 may vary between 3 µm and 500 µm according to various embodiments. The technology and voltage class of the semiconductor device being fabricated may dictate the thickness of the epitaxial layer 13. For example a 1200 V insulated-gate bipolar transistor (IGBT) based on silicon (Si) technology may need an epitaxial layer with a thickness in the range of 90 µm up to 150 µm. In contrast, an epitaxial layer for a 650 V IGBT may have a thickness in the range of 40 µm to 90 µm. The ratio of the thickness of the epitaxial layer 13 (in microns) to the blocking voltage of an IGBT (in Volts) may be between 1:15 and 1:8. In various cases, this ratio is about 1:10.

Figure 1K:
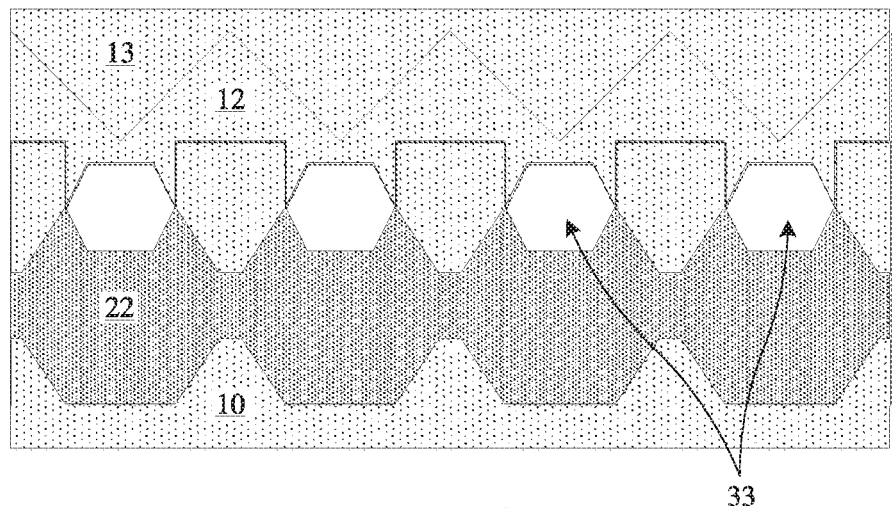

FIG. 1K illustrates a cross-sectional view of the semiconductor substrate after optionally smoothing the epitaxial layer in accordance with an embodiment of the invention.

Referring to FIG. 1K, a top surface of the epitaxial layer 13 is smoothed using a chemical mechanical polishing (CMP) process in one embodiment. Alternatively, the top surface may be smooth without a smoothing step as a result of the one or more epitaxial growth steps and the smoothing step is omitted.

At this stage, further processing may take place as in semiconductor processing to form semiconductor devices in the epitaxial layer 13, for example, as will be further described later. For example, formation of various well regions, doped regions, and gate regions may occur in the epitaxial layer 13. This may involve one or more additional implantation and annealing steps. Additional epitaxial layers may also be formed to provide specific device functionality. Metallization layers may be formed over the device layers. A passivation layer may also be formed after device formation to protect the device layer from backside processing steps.

The oxide region 22 in the semiconductor substrate 10 may now be considered a buried oxide region as a result of the epitaxial layer 13.

FIGS. 2A-2E illustrate an alternative embodiment of fabricating a semiconductor substrate comprising an oxide region in accordance with embodiments of the invention.

Figure 2A:
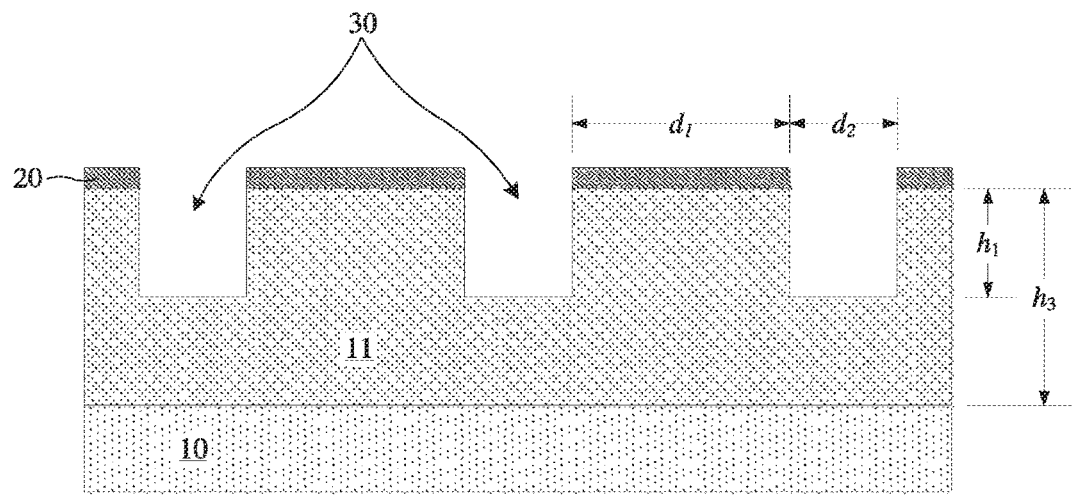

FIG. 2A illustrates a cross-sectional view of a semiconductor substrate comprising an optional doped region and a first mask after forming trenches in the semiconductor substrate and an optional doped region in accordance with embodiments of the invention.

Referring to FIG. 2A, an optional doped region 11 with doped region height $h_3$ is included in the semiconductor substrate 10. The optional doped region 11 may alter the rate of oxide growth compared to that of the semiconductor substrate 10. A possible advantage of controlling the rate of oxide growth with an optional doped region 11 is to allow for larger feature width $d_1$ of the first mask 20. In various embodiments, the doped region height $h_3$ is larger than the trench width $d_2$. In one embodiment, the doped region depth $h_3$ is the same as the deep trench depth $h_2$ as described in reference to FIG. 1D and subsequently in reference to FIG. 2C.

In one embodiment, the optional doped region 11 is formed using an ion implantation method. The ion implantation method may be followed by an annealing process. This may advantageously promote defect-free formation of subsequent epitaxial regions even when the doping of the optional doped region 11 is high. In an alternative embodiment, the optional doped region 11 may be formed by growing a doped epitaxial layer.

Figure 2B:
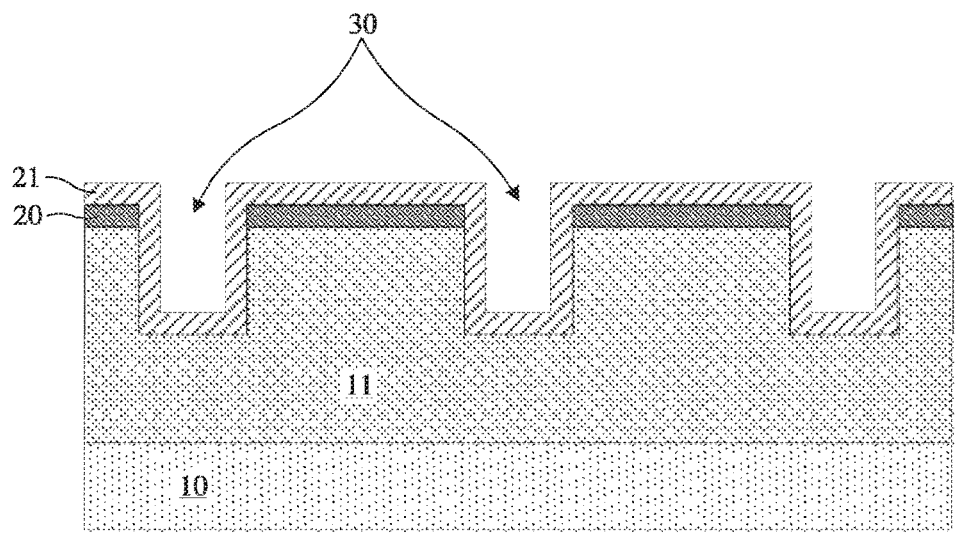

FIG. 2B illustrates a cross-sectional view of the semiconductor substrate after forming a second mask over the trenches, the first mask, and the optional doped region in accordance with embodiments of the invention.

Referring to FIG. 2B, a second mask 21 is formed of the first mask 20, the trenches 30, and the optional doped region 11. The second mask 21 may comprise materials and be formed using methods as previously described.

Figure 2C:
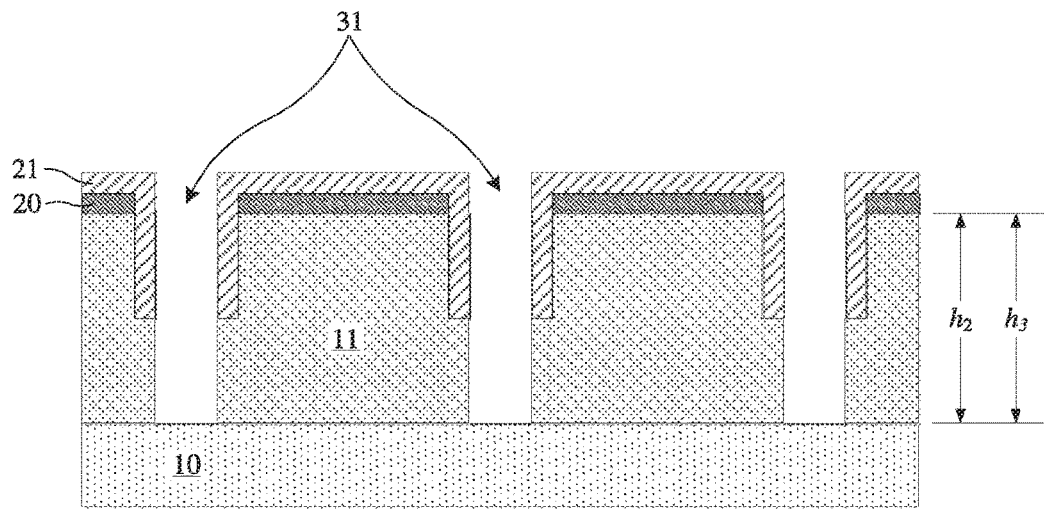

FIG. 2C illustrates a cross-sectional view of the semiconductor substrate after forming deep trenches in the optional doped region in accordance with embodiments of the invention.

Referring to FIG. 2C, deep trenches 31 are formed below the trenches 30 as previously described. In various embodiments the deep trench depth $h_2$ is greater than the doped region height $h_3$. In one embodiment, the deep trench depth $h_2$ equals the doped region height $h_3$.

Figure 2D:
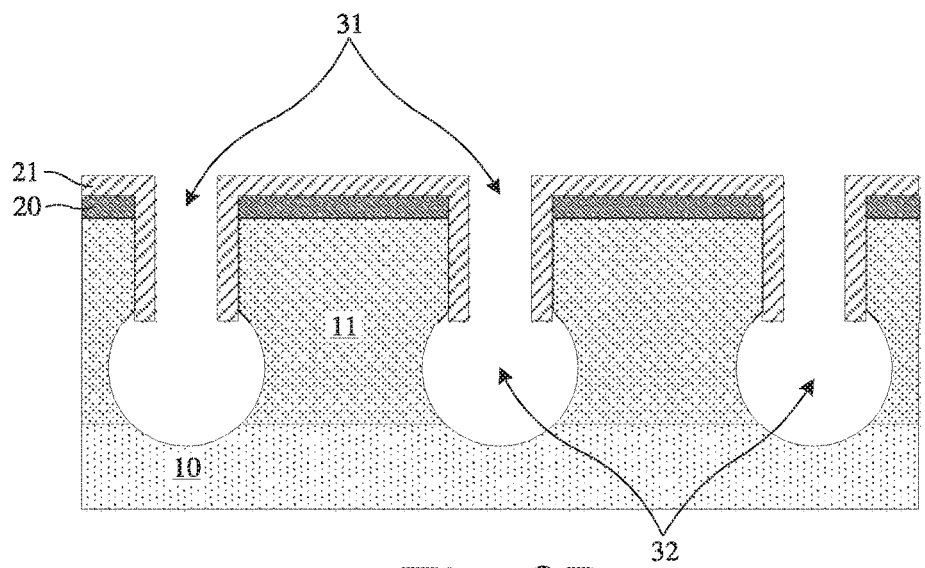

FIG. 2D illustrates a cross-sectional view of the semiconductor substrate after forming enlarged regions in the deep trenches, the optional doped region, and the semiconductor substrate in accordance with embodiments of the invention.

Referring to FIG. 2D, enlarged regions 32 are formed in the lower regions of the deep trenches 31 as previously described. The formation of the enlarged regions 32 may remove portions of only the optional doped region 11 or both the semiconductor substrate 10 and the optional doped region 11.

Figure 2E:
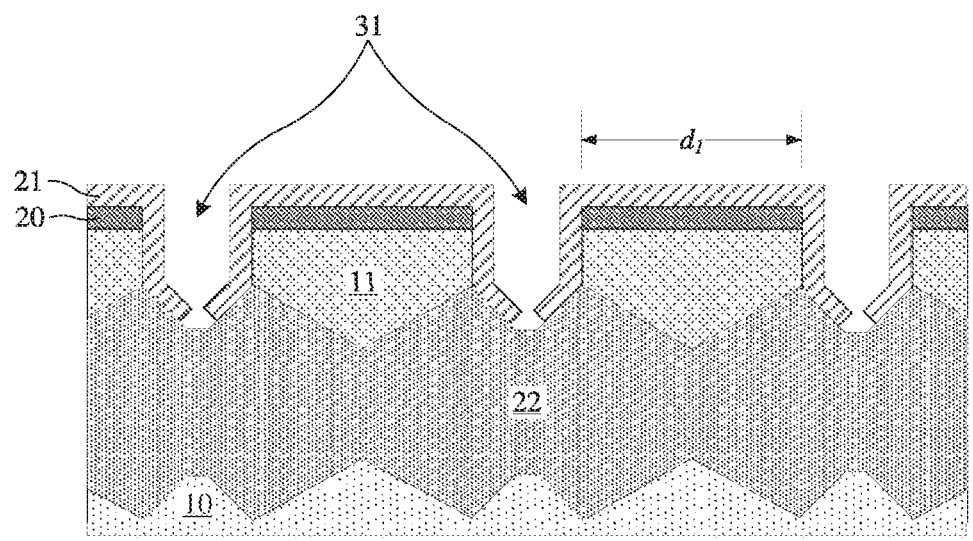

FIG. 2E illustrates a cross-sectional view of the semiconductor substrate after forming an oxide region in the deep trenches, the optional doped region, and the semiconductor substrate in accordance with embodiments of the invention.

Referring to FIG. 2E, an oxide region 22 is formed in the deep trenches 31. The oxide region 22 may comprise materials and be formed using methods as previously described. In contrast to previous embodiments, the optional doped region 11 may increase the lateral oxidation rate during formation of the oxide region 22. This increased lateral oxidation rate may allow the feature width $d_1$ of the first mask to be larger than in previous embodiments. A possible advantage of a larger feature width $d_1$ is reduced strain on the film during the formation of the oxide region 22.

Following the formation of the oxide region 22, processing may continue as described in reference to FIGS. 1G-1K to complete the formation of a semiconductor substrate comprising a buried oxide region. The completed substrate may then be used as a substrate for semiconductor devices as described in reference to FIG. 6.

FIGS. 3A-3E illustrate another alternative embodiment of fabricating a semiconductor substrate comprising a buried oxide region in accordance with embodiments of the invention.

Figure 3A:
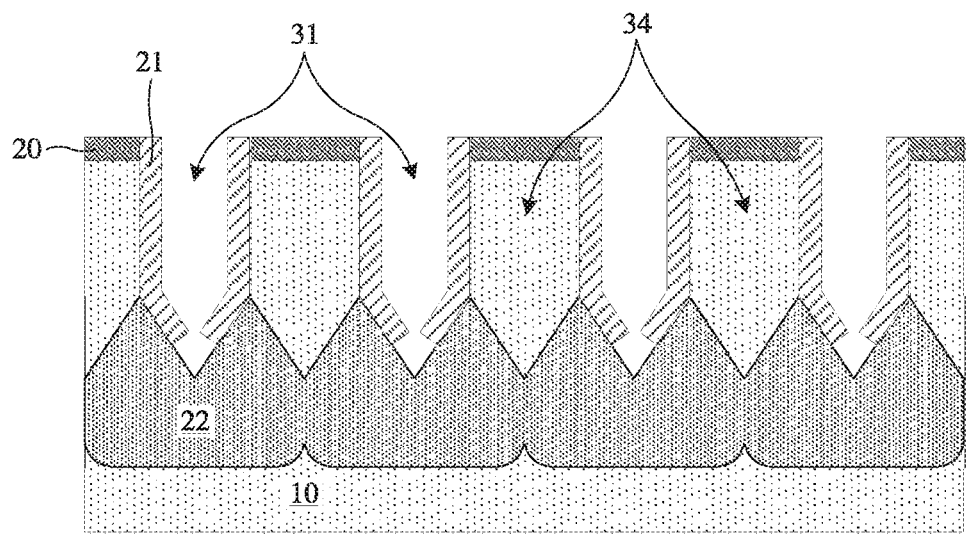

FIG. 3A illustrates a semiconductor substrate comprising a first mask, a second mask, and deep trenches after forming an oxide region in the semiconductor substrate and the deep trenches in accordance with an embodiment of the invention.

Referring to FIG. 3A, an oxide region 22 is formed in deep trenches 31 of a semiconductor substrate 10 as previously described in reference to FIGS. 1A-2E. The semiconductor substrate 10 also includes a first mask 20 and a first mask 21 as previously described. In this embodiment, the enlarged regions 32 of previous embodiments have been omitted. As before, during the formation of the oxide region 22, the oxide grows in each deep trench 31 both outwardly and inwardly from the exposed surfaces of the semiconductor substrate 10 until individual oxide growth fronts meet one another forming a larger oxide structure that isolates the semiconductor regions 34 from the semiconductor substrate 10.

Figure 3B:
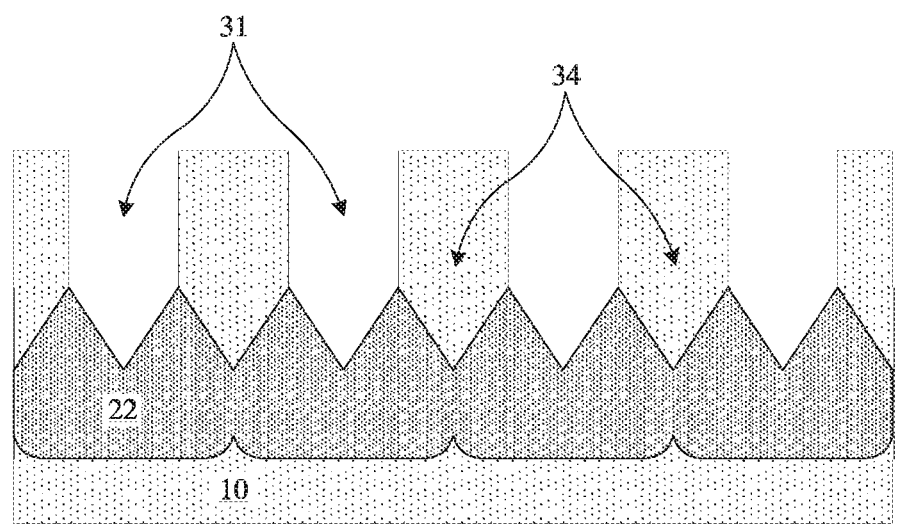

FIG. 3B illustrates the semiconductor substrate after removing the first mask and the second mask in accordance with an embodiment of the invention.

Referring to FIG. 3B, the first mask 20 and the second mask 21 are removed as previously described.

Figure 3C:
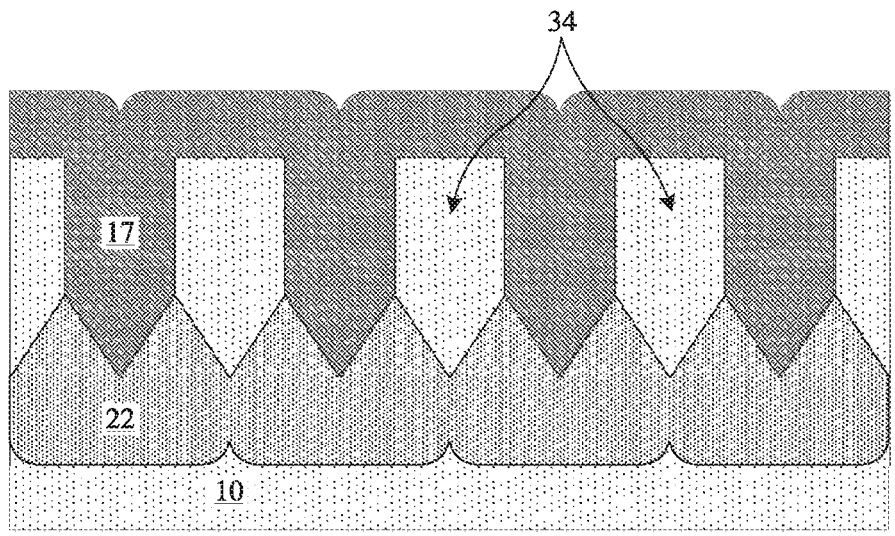

FIG. 3C illustrates the semiconductor substrate after forming a semiconductor layer over the semiconductor substrate and in the deep trenches in accordance with an embodiment of the invention.

Referring to FIG. 3C, a semiconductor layer 17 is formed in the deep trenches 31 and over the semiconductor substrate 10 and the semiconductor regions 34. In various embodiments, the semiconductor layer 17 is materially similar to the semiconductor substrate 10. The semiconductor layer 17 may not have an identical structure and/or orientation as the semiconductor substrate 10. In one embodiment the semiconductor layer 17 is amorphous silicon (a-Si). In an alternative embodiment, the semiconductor layer 17 is polycrystalline silicon (poly-Si). In various embodiments, the semiconductor layer 17 is deposited using a deposition process such as sputtering, vapor deposition process such as low pressure chemical vapor deposition, and others.

Figure 3D:
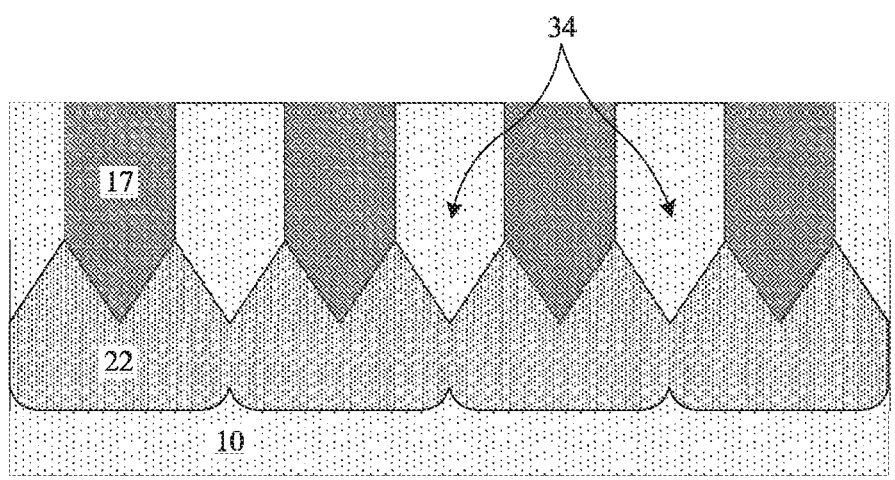

FIG. 3D illustrates the semiconductor substrate after smoothing a top surface of semiconductor layer.

Referring to FIG. 3D, semiconductor layer 17 is smoothed using a suitable process such as chemical mechanical polishing (CMP). In various embodiments, the semiconductor layer 17 is smoothed such that surfaces of the semiconductor substrate 10 are exposed and the material of the semiconductor layer 17 is only in the deep trenches 31. In other embodiments, the semiconductor layer 17 is smoothed such that a top surface of the semiconductor layer 17 is sufficiently smooth and defect-free. In this case, the material of the semiconductor layer 17 may fill the deep trenches 31 and cover the top surfaces of the semiconductor substrate 10.

Figure 3E:
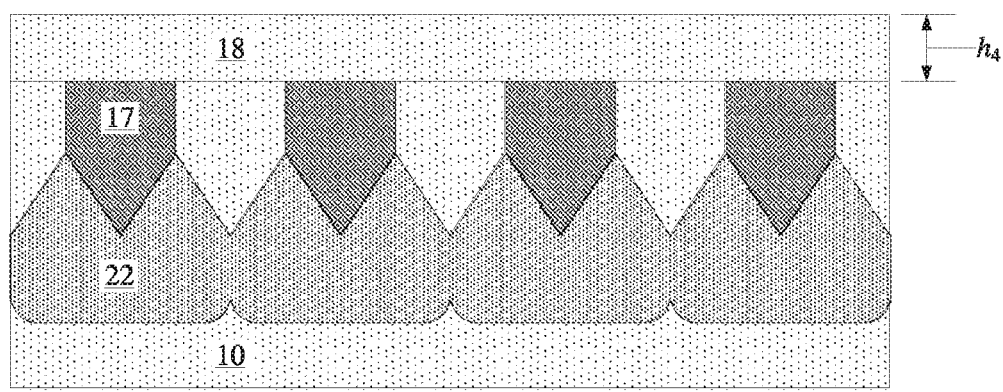

FIG. 3E illustrates the semiconductor substrate after annealing the semiconductor substrate and the semiconductor layer to form an annealed region in accordance with an embodiment of the invention.

Referring to FIG. 3E, the semiconductor substrate 10 and the semiconductor layer 17 are annealed such that portions of the semiconductor regions 34 and the semiconductor layer 17 recrystallize and form a single crystal layer 18 beginning from a top surface of the semiconductor layer 17 and continuing to some depth $h_4$ measured from the top surface. In various embodiments, the depth $h_4$ may range between 100 nm and 1 μm. In one embodiment, the depth $h_4$ is about 500 nm. In another embodiment, the depth $h_4$ is about 1 μm. In one embodiment, the annealing may comprise laser thermal annealing. In another embodiment, the annealing may comprise a rapid thermal annealing, a flash or spike annealing process. The amorphous material of the semiconductor layer 17 may recrystallize even upon annealing at low thermal budgets to form a continuous single crystal region. If the semiconductor layer 17 comprises polysilicon, long high temperature anneals may be used to form a single crystal layer.

The previously described methods of forming the buried oxide region in the semiconductor substrate may have various advantages when compared to conventional methods of forming buried oxide regions. For example, the above embodiments may be much less expensive than the separation by implantation of oxygen (SIMOX) process or wafer bonding processes conventionally used to create silicon-on-insulator (SOI) wafers. Additionally, the processing complexity of the above embodiments may be simpler than the SIMOX or wafer bonding processes.

Additionally, conventional floating zone (FZ) base material may not be available at wafer diameters greater than or equal to 300 mm and magnetic Czochralski (MCz) base material is not of sufficient quality for use where precise resistivity or n-type doping is needed. Therefore, epitaxial regions may be used in these and other circumstances. Epitaxial layers on bulk semiconductor may make the overall substrate and may become undesirably thick. The above embodiments may advantageously allow precise thinning of the substrate using the buried oxide layer as an etch stop while maintaining benefits such as economical production and high quality of the epitaxial region. The above embodiments may provide high quality silicon wafers with greater than or equal to 300 mm diameters suitable for the production of high voltage insulated-gate bipolar transistors (IGBTs) and diodes, for example. In the case of IGBTs the above embodiments may provide a precise depth alignment of the p-emitter-to-field stop profile which is essential for short circuit robustness (current destruction mode). In the case of a freewheeling diode the above embodiment may provide precise control of the n cathode dose after thinning.

FIGS. 4A-4E illustrate several embodiments of a semiconductor substrate after forming a first mask over the semiconductor substrate in accordance with embodiments of the invention. FIGS. 4A-4E illustrate magnified top views of the semiconductor substrate within a die during a process of forming a buried oxide region in a semiconductor substrate such as previously illustrated in FIG. 1A. The following embodiments may be utilized during the processes described in reference to FIGS. 1A-1K, 2A-2E, and 3A-3E, and others.

Figure 4A:
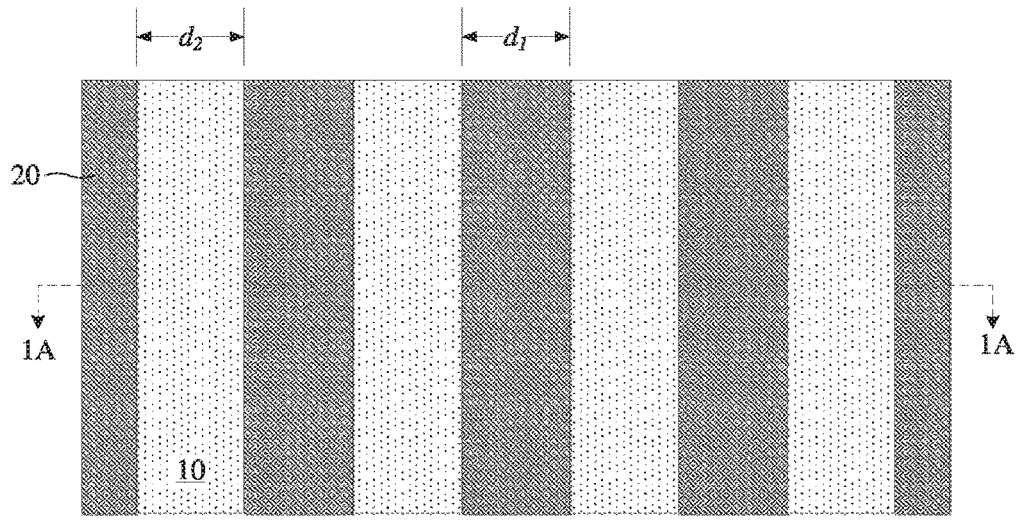

Referring to FIG. 4A, the first mask 20 may be a striped pattern when viewed from a top view with a feature width $d_1$ and a feature pitch $d_2$ such as described in reference to FIG. 1A. In one embodiment, a longest dimension of the stripes extends from one edge of the semiconductor substrate 10 to an opposing edge. In some cases, the edge of the semiconductor substrate may refer to the edge of a wafer, an active region, a patterned region, an exposure region, or a die region. Specifically, a die region may refer to a region that remains after wafer dicing or singulation.

Figure 4B:
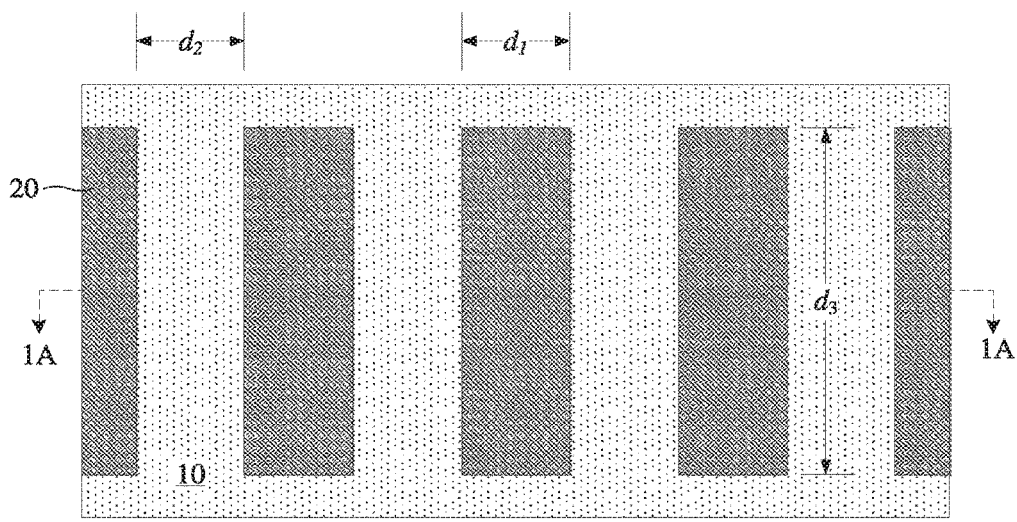
Figure 4C:
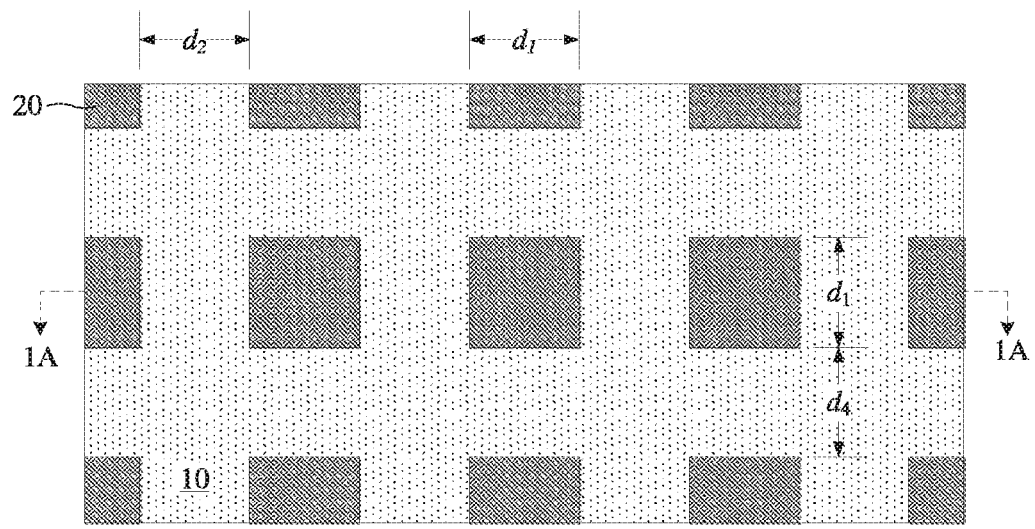
Figure 4D:
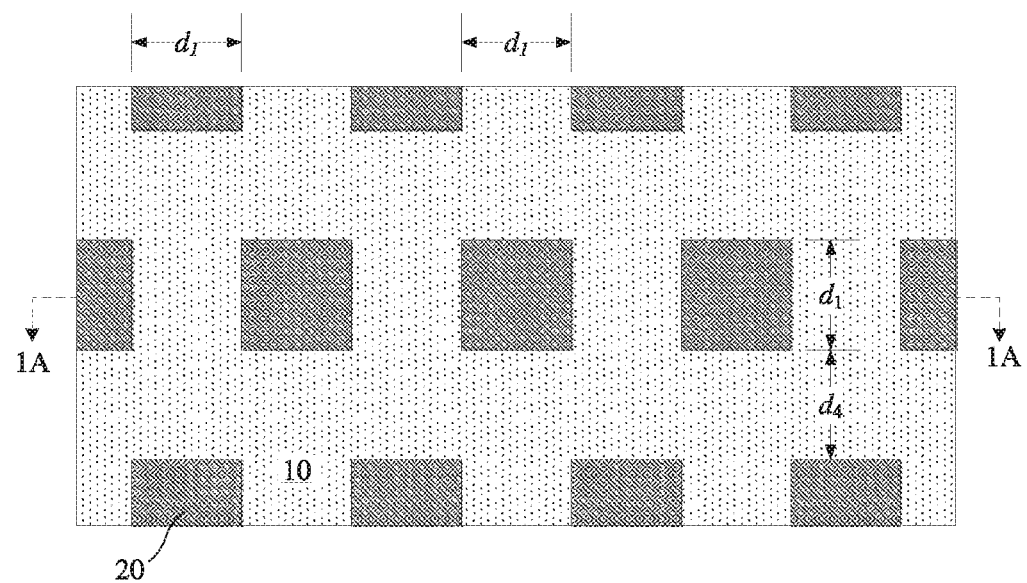

Referring to FIG. 4B, the first mask 20 may be a periodic pattern of rectangles when viewed from a top view with a feature width $d_1$ and a feature pitch $d_2$ as described in reference to FIG. 1A and a feature length $d_3$. In one embodiment, the ratio of the feature width to the feature length $d_1:d_3$ is about 1:40. In various embodiments, the ratio $d_1:d_3$ ranges between 1:1 and 1:100. The specific case in which $d_1:d_3$ is about 1:1 is illustrated in FIGS. 4C and 4D. In one embodiment, the feature length $d_3$ is about 20 μm.

The first mask 20 is not limited to a single row of rectangles. Multiple rows of rectangles may be utilized to adequately cover the surface of the semiconductor substrate 10 as required by design considerations specific to the devices being fabricated. Additionally, rows of rectangles may be aligned or offset with respect to other rows.

Referring to FIGS. 4C and 4D, the first mask 20 may be a periodic pattern of squares when viewed from a top view with a feature width $d_1$ and a feature pitch $d_2$ as described in reference to FIG. 4B and with a second feature pitch $d_4$. In one embodiment, the ratio $d_2:d_4$ is about 1:1. The rows of squares may be aligned as shown in FIG. 4C, completely offset as shown in FIG. 4D or offset to any degree in between. For the configuration illustrated in FIG. 4D, the feature width $d_1$ and a feature pitch $d_2$ are equal.

Figure 4E:
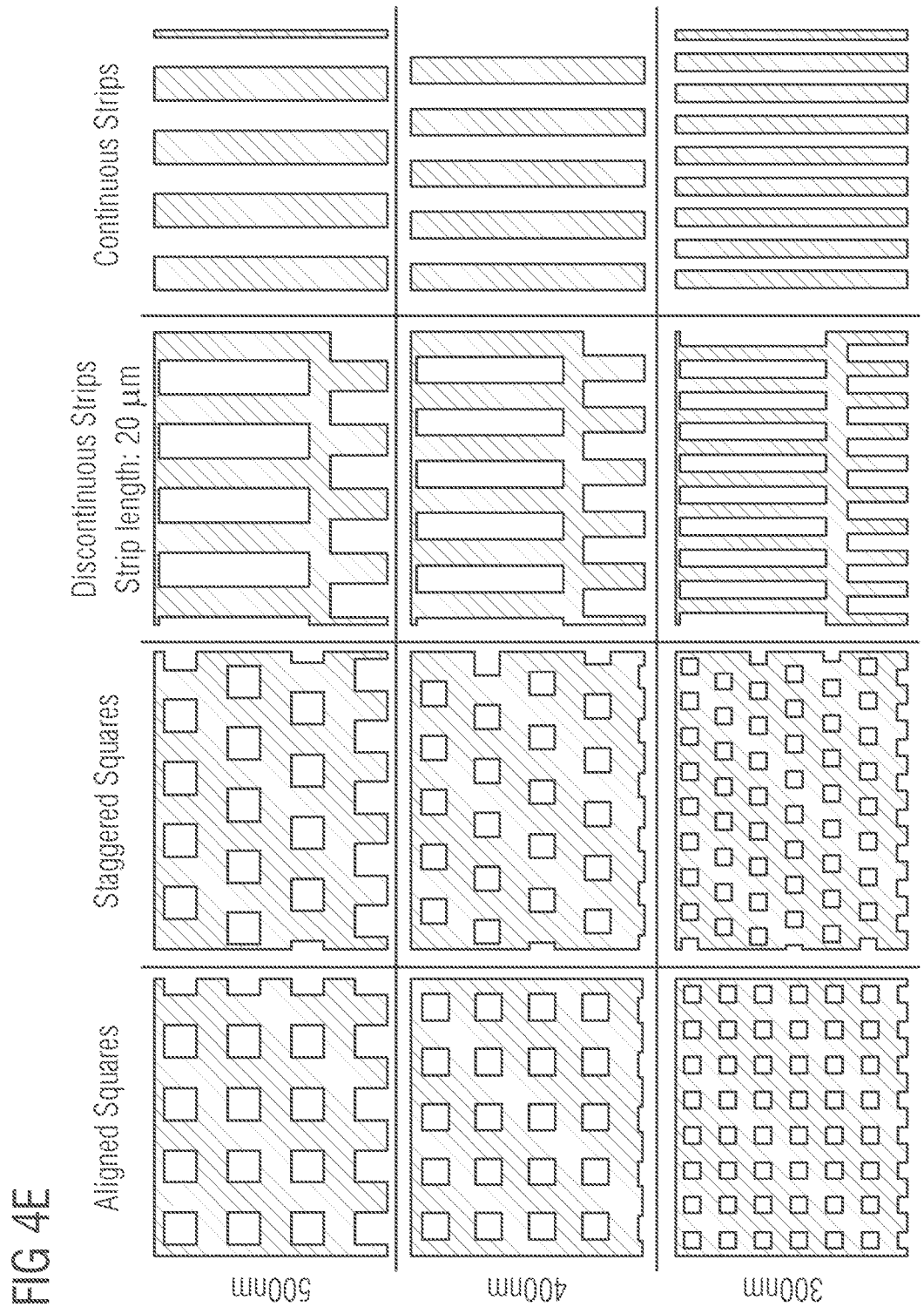

Referring to FIG. 4E, various embodiment patterns and dimensions of the first mask 20 are shown from a top view for direct comparison. Each row illustrates a specific feature size corresponding with the feature width $d_1$ of FIGS. 4A-4D. Each column illustrates a feature shape and alignment. For example, the first column illustrates symmetrical squares, the second column illustrates staggered squares, the third column illustrates discontinuous strips, and the fourth column illustrates continuous strips. The different rows illustrate the possibility of having different feature dimensions such as 300 nm, 400 nm, and 500 nm.

Figure 5A:
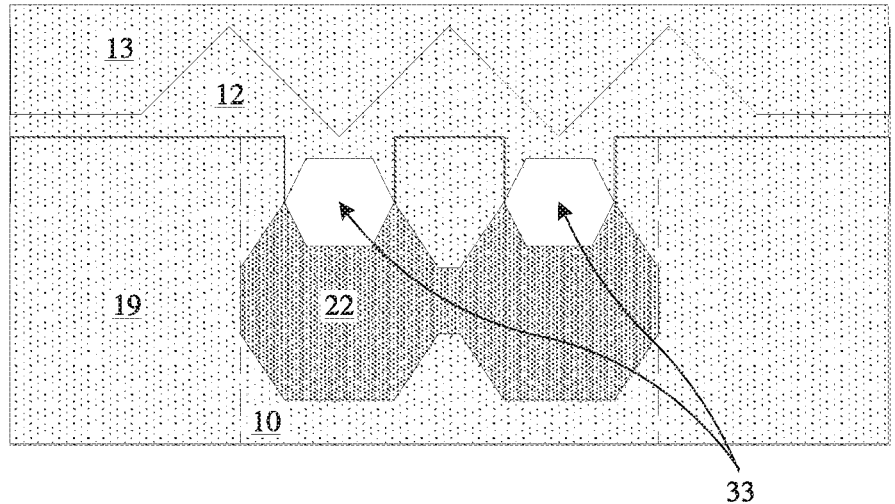
Figure 5B:
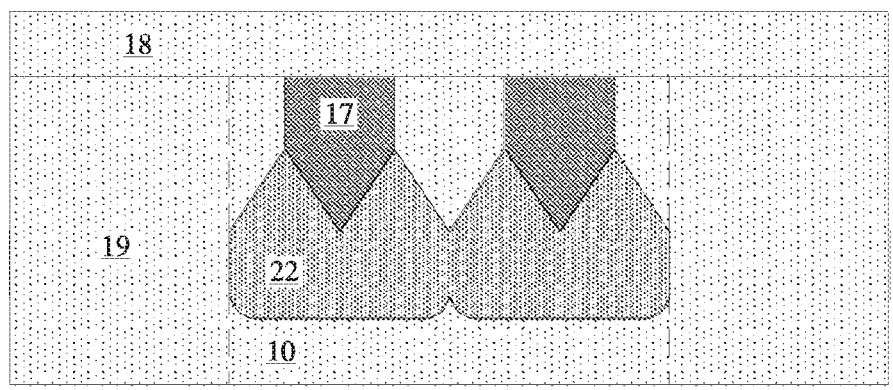

FIGS. 5A and 5B illustrate embodiments of a semiconductor substrate that has a bulk semiconductor region comprising a local buried oxide region in accordance with embodiments of the invention where FIGS. 5A and 5B illustrate cross-sectional views of the semiconductor substrate after forming the buried oxide region.

Referring, to FIG. 5A, a bulk semiconductor region 19 may remain in the semiconductor substrate 10 after forming the oxide region 22. There also may be more than one oxide region 22 in the semiconductor substrate 10. The oxide region 22, void regions 33, epitaxial overgrowth layer 12, and epitaxial layer 13 may be formed using processes in previous embodiments such as previously described in reference to FIG. 1A-1K, 2A-2E, or 3A-3E.

In FIG. 5B an alternative embodiment of a semiconductor substrate 10 that has a bulk semiconductor region 19 and an oxide region 22 is illustrated. As before multiple buried oxide regions may be present within the semiconductor substrate 10. The oxide region 22, the semiconductor layer 17, and the annealed region (single crystal region 18) may be formed using processes in previous embodiments such as previously described in reference to FIGS. 3A-3E.

Subsequent processing may follow as further described in more detail in FIG. 6A-6H or 7A-7C. In one embodiment, a lateral component may be formed over the oxide region 22 while a vertical device may be formed in the bulk semiconductor regions 19.

FIGS. 6A-6H illustrate an embodiment of fabricating a semiconductor device from a semiconductor substrate comprising a buried oxide region in accordance with embodiments of the invention. The semiconductor substrate comprising a buried oxide region may be formed as previously described in reference to FIGS. 1A-1K, 2A-2E, and 3A-3E as well as others.

Figure 6A:
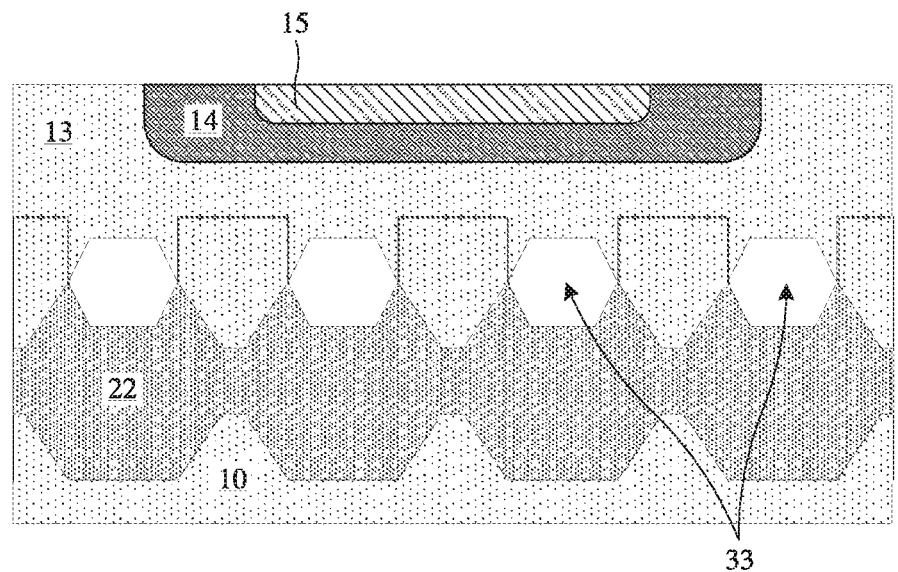

FIG. 6A illustrates a cross-sectional view of a semiconductor device after forming a well region in an epitaxial layer of a semiconductor substrate comprising a buried oxide region and subsequently forming a doped region in the well region in accordance with an embodiment of the invention.

Referring to FIG. 6A, the semiconductor device comprises a semiconductor substrate 10 including an epitaxial layer 13 and an oxide region 22 buried beneath the epitaxial layer 13. The semiconductor substrate 10 and oxide region 22 may be formed in accordance with embodiments as previously described in reference to FIGS. 1A-1K, 2A-2E, and 3A-3E. The semiconductor substrate 10 may include void regions 33 between the oxide region 22 and the epitaxial layer 13. It should be noted that the epitaxial overgrowth layer 12 illustrated in FIGS. 1H-1K is not shown in FIGS. 6A-6H for clarity. As previously described, the epitaxial layer 13 may be grown in a single process step or beginning with an epitaxial overgrowth layer and growing one or more epitaxial layers on top of the initial growth.

A well region 14 is formed in the epitaxial layer 13 of a semiconductor substrate 10. A doped region 15 is formed in the well region 14. The well region 14 and the doped region 15 may be formed using an ion implantation and diffusion process, and others. The doped region 15 may be formed by counter doping the well region 14. In one embodiment, the well region 14 has an opposite doping type as the epitaxial layer 13. In one embodiment, the doped region 15 has an opposite doping type as the well region 14 and the same doping typing as the epitaxial layer 13.

Figure 6B:
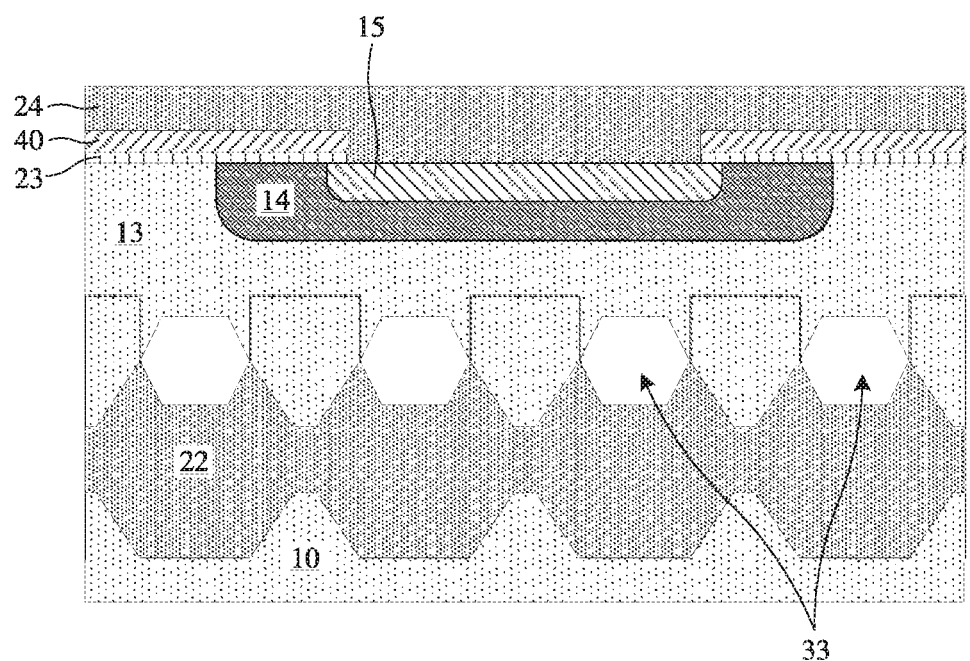

FIG. 6B illustrates a cross-sectional view of the semiconductor device after forming gate dielectric regions and gate regions over the epitaxial layer, the well region, and the doped region and subsequently forming an insulating region over the gate regions and doped region in accordance with an embodiment of the invention.

Referring to FIG. 6B, one or more gate dielectric regions 23 are formed over the epitaxial layer 13, the well region 14, and the doped region 15. The gate dielectric regions 23 may be grown or deposited, for example, on the surface of the epitaxial layer 13, well region 14, and doped region 15. The gate dielectric regions 23 may be formed using deposition methods such as chemical vapor deposition (CVD), physical vapor deposition (PVD), molecular beam epitaxy (MBE), and atomic layer deposition (ALD).

In various embodiments, the gate dielectric regions 23 comprise a dielectric material. In various embodiments, the dielectric material is a high-K dielectric material. There may be a clean interface between the gate dielectric regions 23 and the epitaxial layer 13. In one embodiment, the epitaxial layer 13 is silicon and the gate dielectric regions 23 are silicon dioxide ($SiO_2$) that has been grown using a thermal oxidation process.

Still referring to FIG. 6B, one or more gate regions 40 are formed over the gate dielectric regions 23. The gate regions 40 may be formed using a physical vapor deposition (PVD) methods such as electron beam evaporation or sputter deposition, for example. In various embodiments, the gate regions 40 are an electrically conducting material. In one embodiment, the gate regions 40 are polysilicon. In another embodiment, the gate regions 40 are a metal. In various embodiments, the gate regions 40 include a silicide.

An insulating region 24 is formed over the gate regions 40, the gate dielectric regions 23, and the doped region 15. The insulating region 24 may be formed using a deposition process such as chemical vapor deposition (CVD), physical vapor deposition (PVD), molecular beam epitaxy (MBE), and atomic layer deposition (ALD). In various embodiments, the insulating region 24 has the same material composition as the gate dielectric regions 23. In alternative embodiments, the insulating region 24 is an electrically insulating material that is different from the material of the gate dielectric regions 23.

Figure 6C:
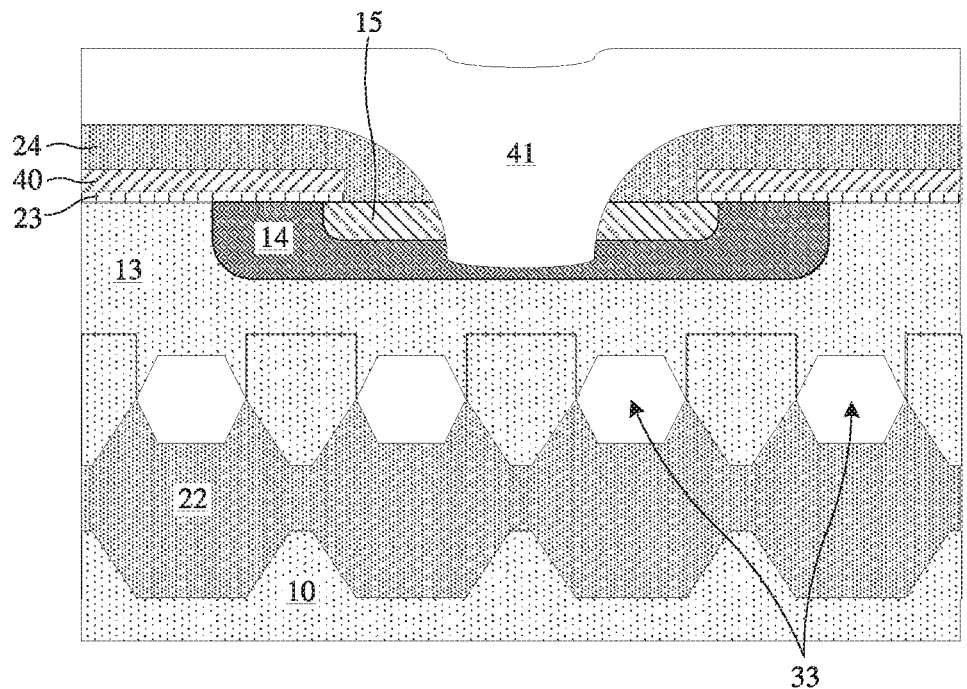

FIG. 6C illustrates a cross-sectional view of the semiconductor device after forming a top contact in accordance with an embodiment of the invention.

Referring to FIG. 6C, a top contact 41 is formed over the insulating region 24, the doped region 15, and the well region 14. The top contact 41 may extend into the doped region 15 and well region 14 as illustrated in FIG. 6C and provide electrical and/or thermal contact to the well region 14 and the doped region 15. This may be accomplished by first forming a recessed region in the insulating region 24, the doped region 15, and the well region 14. An optional barrier layer may be formed before forming the top contact 41 to prevent inter-diffusion between the doped region 15, the well region 14, and the top contact 41. Alternatively, no recessed region is formed and electrical and/or thermal contact to the well region 14 and the doped region 15 is made through other suitable means.

In various embodiments, the top contact 41 comprises a metal or a metal alloy. The top contact 41 may comprise one or more of aluminium (Al), copper (Cu), silver (Ag), gold (Au), palladium (Pd), platinum (Pt), tungsten (W), and others. In various embodiments, the top contact 41 may include additives such as silicon (Si), nickel (Ni), tin (Sn), vanadium (V), hafnium (Hf), lead (Pb), and others. The top contact 41 may include multiple layers in some embodiments. In other embodiments, the top contact 41 is single layer. The top contact 41 may be formed using a deposition process. In various embodiments, the top contact 41 is formed using a chemical vapor deposition (CVD), plasma enhanced CVD, chemical solution deposition, physical vapor deposition (PVD), atomic layer deposition (ALD), molecular beam epitaxy (MBE), plating, and, in one embodiment, is formed using sputter deposition.

Figure 6D:
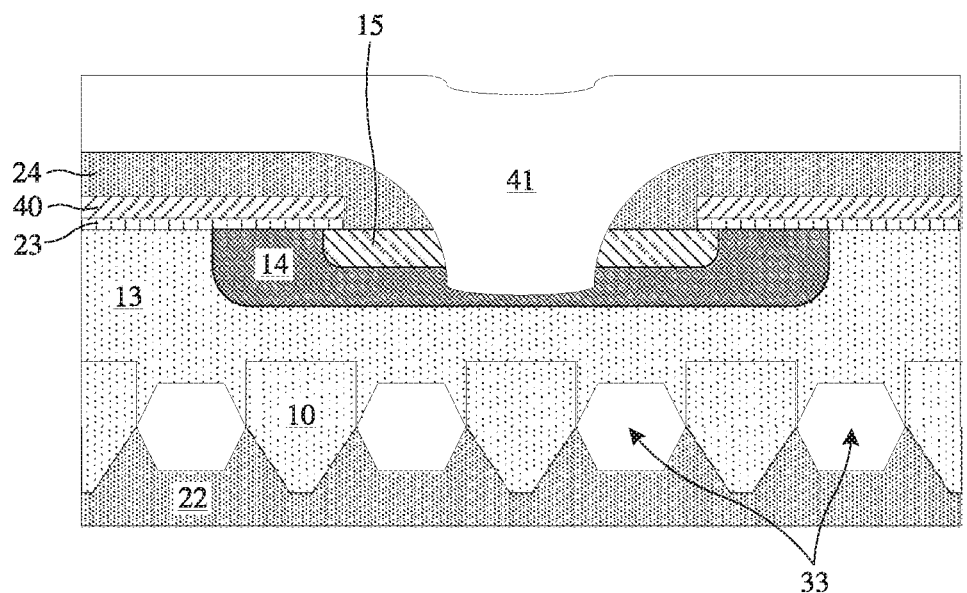

FIG. 6D illustrates a cross-sectional view of the semiconductor device after thinning the semiconductor substrate in accordance with an embodiment of the invention.

Referring to FIG. 6D, the semiconductor substrate 10 is thinned using the oxide region 22 as an etch stop. In various embodiments, the semiconductor substrate 10 is thinned using a chemical mechanical polishing (CMP) process. In one embodiment, the semiconductor substrate 10 is thinned using the TAIKO process. The TAIKO process is a wafer thinning process in which an outer support ring along the edge of the wafer is not thinned during the thinning process. The outer support ring may provide improved thin wafer handling during subsequent processing. For example, wafers that are thinned using the TAIKO process can typically maintain their rigidity without being attached to an additional hard substrate.

In the absence of the oxide region 22, thinning of the semiconductor substrate 10 may result in +/−3 μm fluctuations in the thickness of the semiconductor substrate 10. These large fluctuations are then accounted for in the design and dimensioning of the semiconductor devices which results in a lowering of the performance of the corresponding semiconductor devices. However, one possible advantage of using the oxide region 22 as an etch stop is increased precision of the thinning process. This increased precision of the thickness of the semiconductor substrate 10 may allow for a tighter operational range and specification for the semiconductor device resulting in higher performance and more predictable response.

Figure 6E:
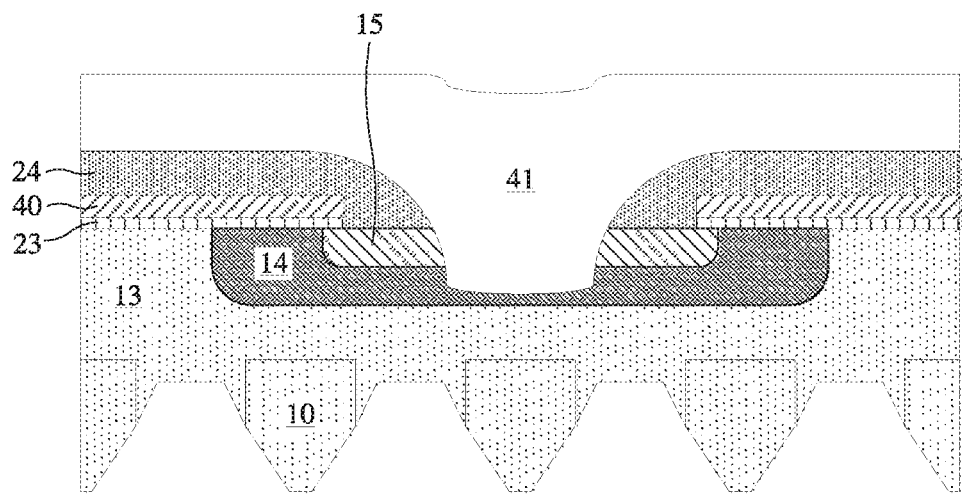

FIG. 6E illustrates a cross-sectional view of the semiconductor device after removing the oxide region in accordance with an embodiment of the invention.

Referring to FIG. 6E, the oxide region 22 is selectively removed from the backside of the semiconductor substrate 10. In various embodiments, the oxide region 22 is removed using a chemical wet etching process.

Figure 6F:
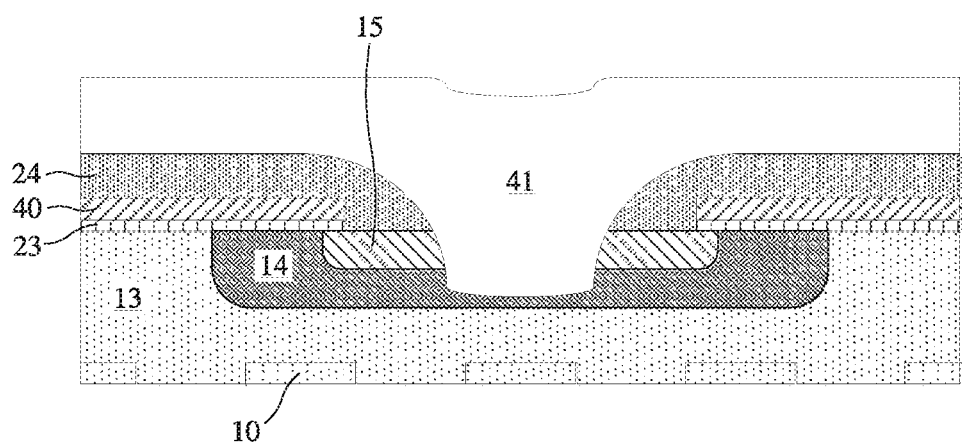

FIG. 6F illustrates a cross-sectional view of the semiconductor device after smoothing the bottom of the semiconductor substrate and the epitaxial layer in accordance with an embodiment of the invention.

Referring to FIG. 6F, the backside of the semiconductor substrate 10 and the epitaxial layer 13 may be smoothed using a brief etching process. In various embodiments, the brief etching process is accompanied by a polishing step. In one embodiment, the semiconductor substrate 10 and the epitaxial layer 13 are smoothed using a chemical mechanical polishing (CMP) process.

Figure 6G:
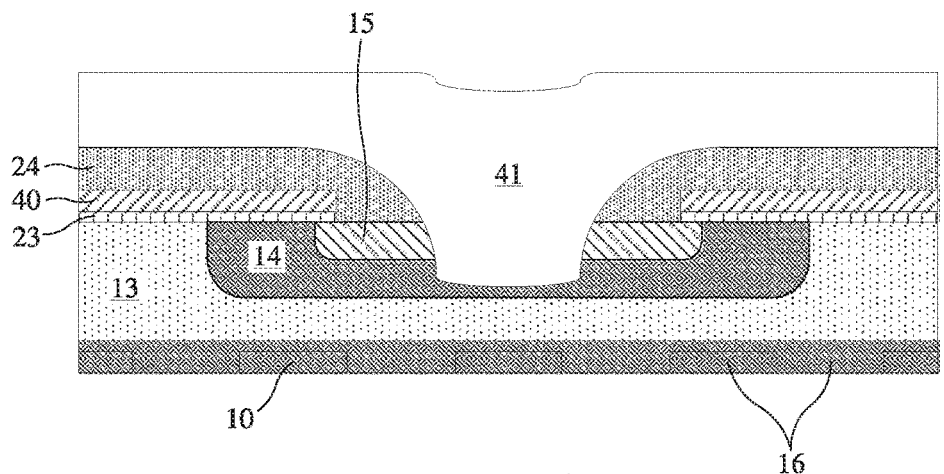

FIG. 6G illustrates a cross-sectional view of the semiconductor device after forming an optional implantation region in the semiconductor substrate and the epitaxial layer in accordance with an embodiment of the invention.

Referring to FIG. 6G, an optional implantation region 16 is formed in the semiconductor substrate 10 and the epitaxial layer 13 from a backside surface of the semiconductor device. The optional implantation region 16 may be doped using ion implantation methods from the back side that is being processed. In one embodiment, the optional implantation region 16 has the opposite doping type as the semiconductor substrate 10 and the epitaxial layer 13 and the semiconductor device is an insulated-gate bipolar transistor (IGBT) device. In an alternative embodiment, the optional implantation region 16 has the same doping type as the semiconductor substrate 10 and the epitaxial layer 13 and the semiconductor device is a planar metal-oxide-semiconductor field-effect transistor (MOSFET) device. Alternatively, the concept can be used for freewheeling diodes. The IGBT (planar and trench) device, the freewheeling diode and the planar or trench MOSFET device may be power semiconductor devices.

Figure 6H:
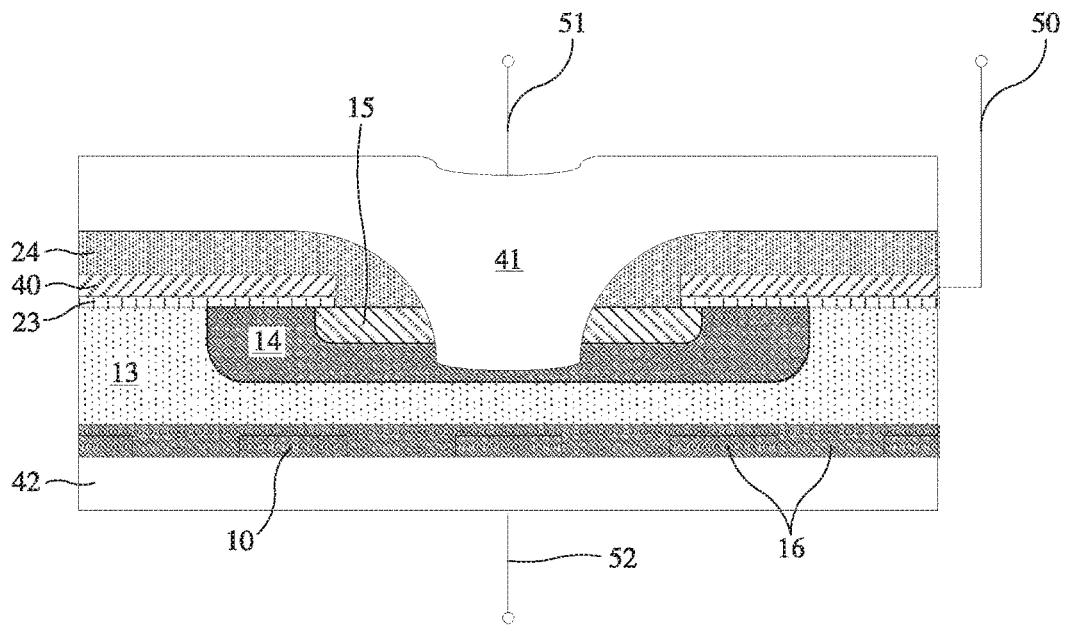

FIG. 6H illustrates a cross-sectional view of the semiconductor device after forming a bottom contact and subsequently coupling a gate connection, a top connection, and a bottom connection to one or more of the gate regions, the top contact, and the bottom contact respectively in accordance with an embodiment of the invention.

Referring to FIG. 6H, a bottom contact 42 is formed over the semiconductor substrate 10 and the epitaxial layer 13 from the backside surface of the semiconductor device. The bottom contact 42 may provide electrical and/or thermal contact to the optional implantation region 16, the semiconductor substrate 10, and the epitaxial layer 13. In various embodiments, the bottom contact 42 comprises a metal or a metal alloy. The possible constituent materials of the bottom contact 42 are similar to those previously described for the top contact 41 in reference to FIG. 6C. In one or more embodiments, the bottom contact 42 comprises a stack of aluminum/tin/silver, a stack of titanium nitride/copper/tin/silver, and others. In various embodiments, the bottom contact 42 is formed using a chemical vapor deposition (CVD), plasma enhanced CVD, chemical solution deposition, physical vapor deposition (PVD), atomic layer deposition (ALD), molecular beam epitaxy (MBE), plating, and, in one embodiment, is formed using sputter deposition.

As with the top contact 41, the bottom contact 42 may comprise multiple layers and may include a barrier layer to prevent inter-diffusion between the optional implantation region 16, the semiconductor substrate 10, and the epitaxial layer 13 and the bottom contact 42.

Still referring to FIG. 6H, the one or more gate regions 40 are electrically coupled to a gate connection 50, the top contact 41 is electrically coupled to a top connection 51, and the bottom contact 42 is electrically coupled to a bottom connection 52. In one embodiment, the semiconductor device is an insulated-gate bipolar transistor (IGBT) device and so the top connection 51 is an emitter connection and the bottom connection 52 is a collector connection. In an alternative embodiment, the semiconductor device is a planar metal-oxide-semiconductor field-effect transistor (MOSFET) device and so the top connection 51 is a source connection and the bottom connection 52 is a drain connection.

Other semiconductor devices using a buried oxide region formed in accordance with embodiments of the invention are also possible. For example, the semiconductor device may be a different power device such as a discrete PN diode, Schottky diode, junction gate field-effect transistor (JFET), bipolar junction transistor (BJT), depletion enhancement MOSFET, lateral double-diffused MOSFET (LDMOSFET), and others. As such, embodiments of the invention may afford the advantages of substrates comprising buried oxide regions to any of these devices as well as others.

Figure 7A:
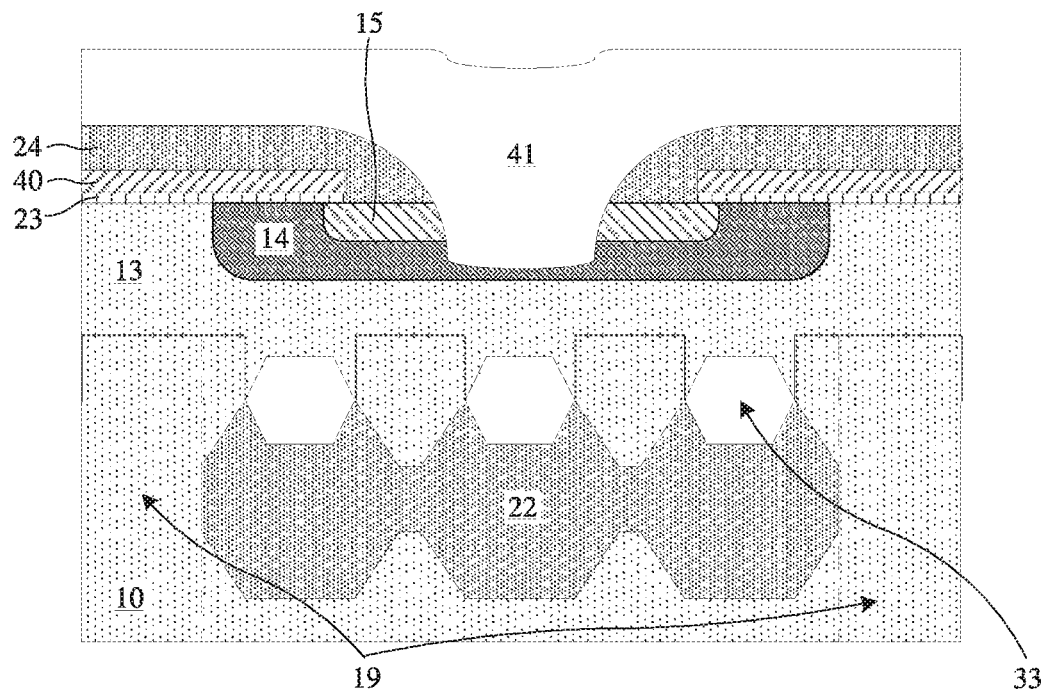
Figure 7B:
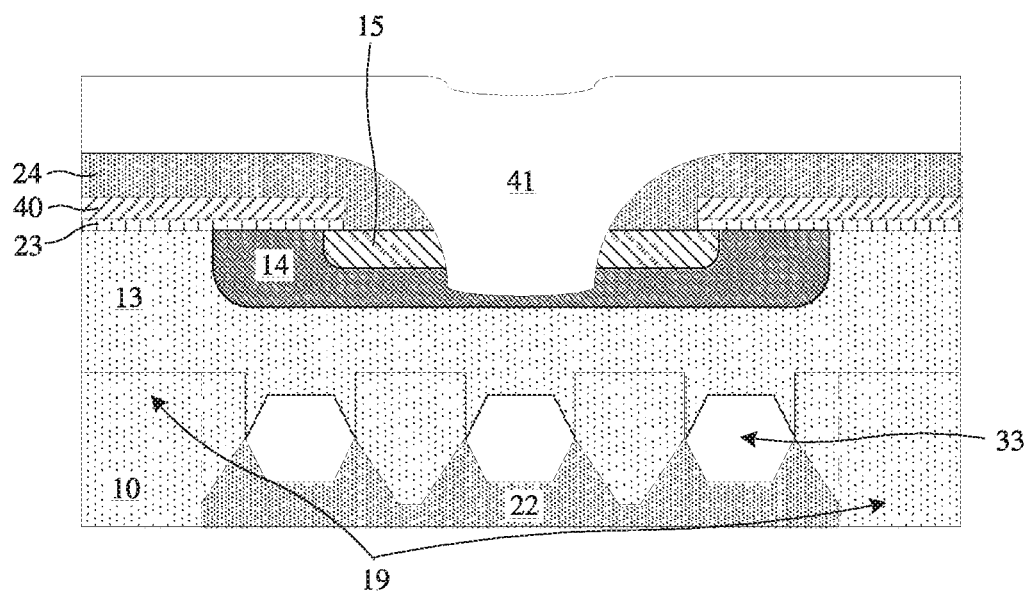
Figure 7C:
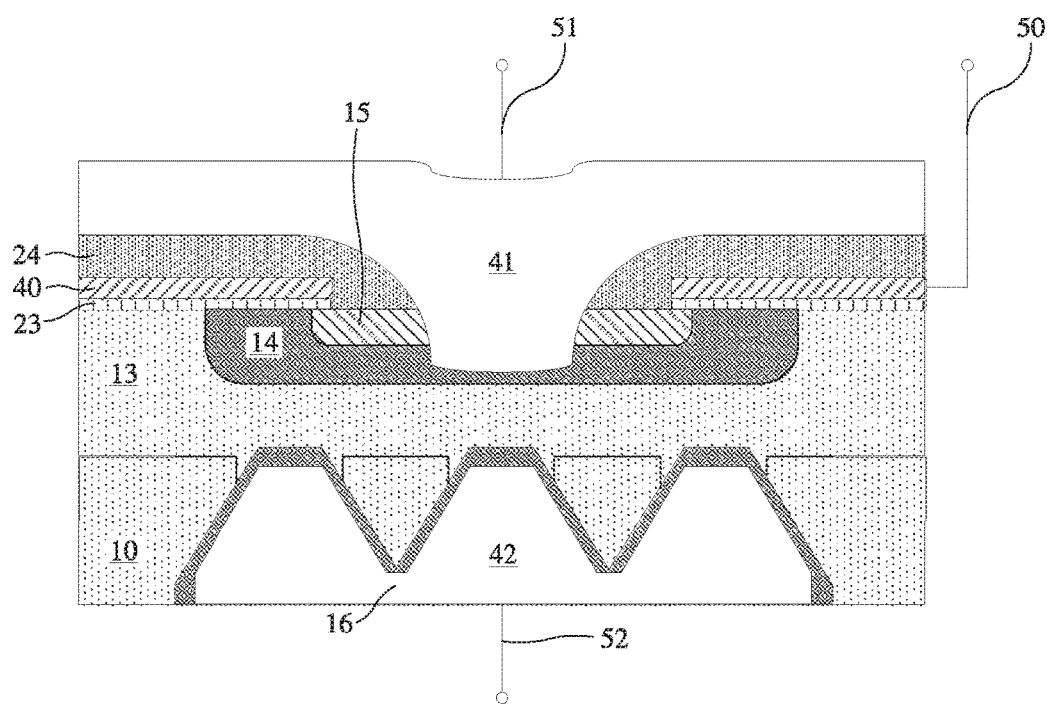

FIGS. 7A-7C illustrate an embodiment of fabricating a semiconductor device from a semiconductor substrate that has a bulk semiconductor region comprising a buried oxide region in accordance with embodiments of the invention. The semiconductor substrate that has a bulk semiconductor region comprising a buried oxide region may be formed as previously described in reference to FIGS. 5A and 5B.

FIG. 7A illustrates a cross-sectional view of the semiconductor device after forming a well region, a doped region, gate dielectric regions, gate regions, and an insulation region, and subsequently forming a top contact.

Referring to FIG. 7A, the well region 14, doped region 15, gate dielectric regions 23, gate regions 40, insulation region 24, and top contact 41 may be formed as previously described. The semiconductor device at this stage of fabrication is notably different than in previous embodiments because of one or more bulk semiconductor regions 19 remaining in the semiconductor substrate 10. A single locally confined buried oxide region is illustrated here, but multiple buried oxide regions are possible.

FIG. 7B illustrates a cross-sectional view of the semiconductor device after thinning the semiconductor substrate.

Referring to FIG. 7B, the semiconductor substrate 10 is thinned using previously described techniques. This may result in a larger volume of the semiconductor substrate 10 remaining in the semiconductor device compared to previous embodiments. Optionally, the thinning of the semiconductor substrate 10 may be omitted in some embodiments. Instead, a mask may be formed over the semiconductor substrate 10 and the semiconductor substrate 10 may be subsequently etched to expose the one or more oxide regions 22.

FIG. 7C illustrates a cross-sectional view of the semiconductor device after removing the buried oxide region, forming an optional implantation region, filling the void vacated by buried oxide region to form a bottom contact, and subsequently coupling a gate connection, a top connection, and a bottom connection to one or more of the gate regions, the top contact, and the bottom contact respectively.

Referring to FIG. 7C, the oxide region 22 is removed as previously described. This may leave a recessed region in the semiconductor substrate 10 that may be filled with a conductive material to form a bottom contact 42. As previously described, an optional implantation region 16 may also be incorporated before the formation of the bottom contact 42.

Bottom contacts formed in this way may advantageously allow the semiconductor substrate 10 to be thicker because the interface between the bottom contact 42 and the epitaxial layer 13 is closer to the top side of the device. Thus, this device may electrically perform like a thinned device. Consequently, less thinning and/or less precise thinning may be required. The thinning process may be avoided entirely if a mask and etching process are used.

The buried oxide region size and location may be adjusted to obtain desirable device characteristics. For example, the buried oxide region may be made larger or smaller to change the length of the drift region. Alternatively, two buried oxide regions may be employed directly under the gate regions. However, any number of buried oxide regions are possible.

Still referring to FIG. 7C, the one or more gate regions 40 are electrically coupled to a gate connection 50, the top contact 41 is electrically coupled to a top connection 51, and the bottom contact 42 is electrically coupled to a bottom connection 52 as previously described.

The above embodiments may be used to fabricate any number of semiconductor devices on a single substrate. In many power applications, for example, a single cell contains thousands of devices. Different types of semiconductor devices may be on the same substrate. Some of the devices on a substrate may make use of buried oxide regions during fabrication and/or as an isolation layer while other devices on the substrate may not have a buried oxide region in the vicinity or may use the buried oxide region in a different way.

Figure 8A:
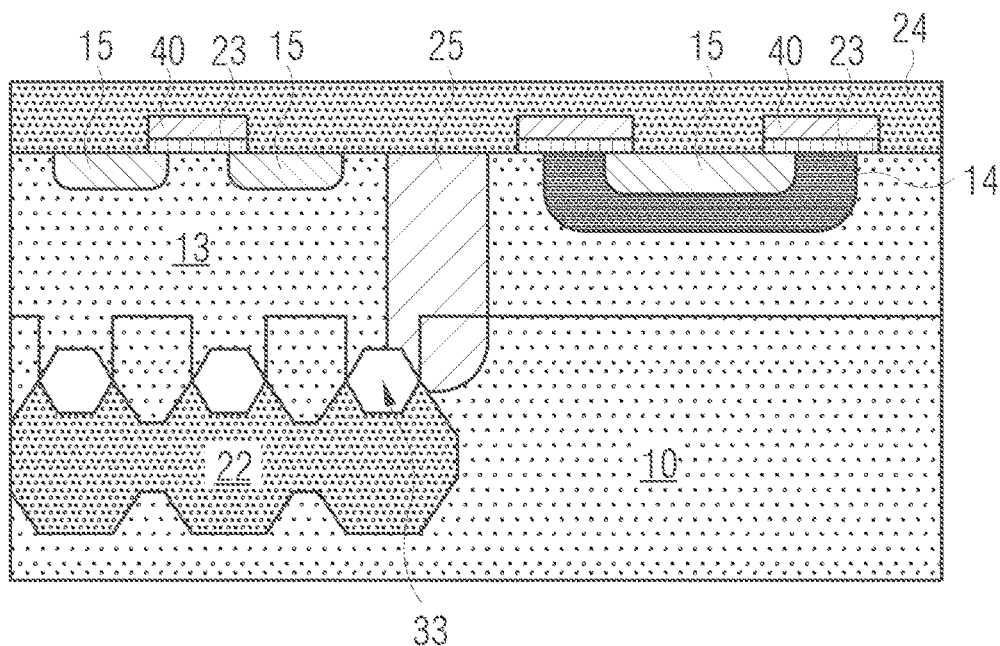
Figure 8B:
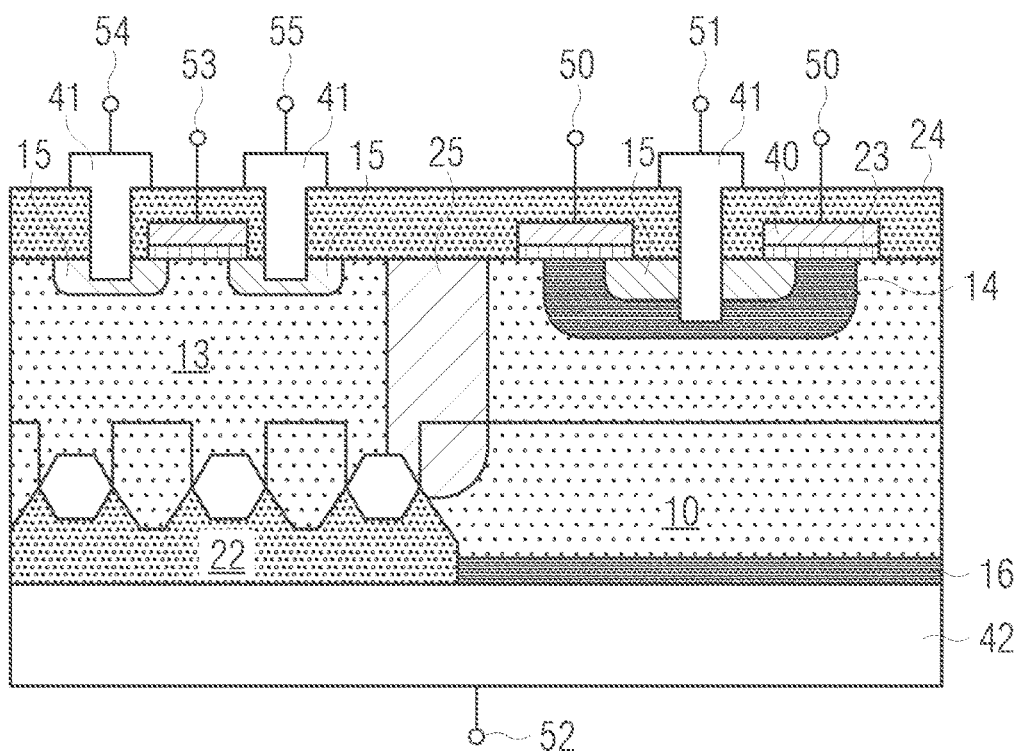

FIGS. 8A and 8B illustrate an embodiment of fabricating semiconductor devices from a semiconductor substrate that has a bulk semiconductor region comprising a buried oxide region in accordance with embodiments of the invention. The semiconductor substrate that has a bulk semiconductor region comprising a buried oxide region may be formed as previously described in reference to FIGS. 5A and 5B.

FIG. 8A illustrates a cross-sectional view of the semiconductor substrate after forming a well region, doped regions, an isolating trench, gate dielectric regions, gate regions, and an insulation region.

Referring to FIG. 8A, the well region 14, doped regions 15, gate dielectric regions 23, gate regions 40, and insulation region 24 may be formed as previously described. As with FIGS. 7A-7C, the semiconductor substrate 10 has a localized oxide region 22. An isolating trench 25 is formed to electrically isolate devices formed in the semiconductor substrate.

FIG. 8B illustrates a cross-sectional view of the semiconductor substrate after forming top contacts, thinning the semiconductor substrate, forming an implantation region and bottom contact, and subsequently coupling a gate connection, top connection, a bottom connection, a second gate connection, a source connection, and a drain connection to one or more gate regions, top contacts, and bottom contacts.

Referring to FIG. 8B, top contacts 41 are formed as previously described. The semiconductor substrate 10 is then thinned to expose the oxide region 22 using previously described techniques. An implantation region 16 is then be formed as previously described. A bottom contact 42 is then formed. The bottom contact 42 is isolated from various active device regions by the oxide region 22.

Various connections may then be made to the well region 14, doped regions 15, and gate regions 40. For example, the active device regions formed over the oxide region 22 may be lateral devices that are electrically isolated from the bottom contact by the oxide region 22 while the active device regions that are not over the oxide region 22 may be vertical devices that are electrically coupled to the bottom contact. In this case, gate connections 50 may be coupled to the gate regions 40 that are not over the oxide region 22. A top connection 51 and a bottom connection 52 may be coupled as previously described to form the source and drain connections of a vertical device. A second gate connection 53 may be coupled to the gate region 40 that is over the oxide region 22. A source connection 54 and a drain connection 55 may then be coupled to the doped regions 15 that are over the buried oxide region 22.

Localized oxide regions may be used in this way to isolate lateral devices from the bottom contacts of vertical devices on the same semiconductor substrate. As before, although only two devices are illustrated in FIGS. 8A and 8B, any number of devices may be fabricated on a single semiconductor substrate using previously described embodiments.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described above, e.g., in FIGS. 1-8, may be combined with each other in alternative embodiments. It is therefore intended that the appended claims encompass any such modifications or embodiments.

What is claimed is:

1. A method of fabricating a semiconductor device, the method comprising:
   forming a buried insulation region within a substrate by processing the substrate using etching and deposition processes, wherein forming the buried insulation region comprises forming a plurality of openings in a semiconductor substrate, and forming an oxide within the plurality of openings, wherein the forming of the oxide comprises converting regions of the semiconductor substrate between adjacent ones of the plurality of openings into the oxide;
   forming a semiconductor layer over the buried insulation region at a first side of the substrate;
   forming device regions in the semiconductor layer;
   thinning the substrate from a second side of the substrate to expose the buried insulation region; and
   forming a conductive region on the thinned second side of the substrate.

2. The method of claim 1, further comprising removing the buried insulation region to expose a bottom surface of the substrate; and
   forming the conductive region under the bottom surface of the substrate.

3. The method of claim 1, wherein forming the device regions comprises:
   forming a source region having a first conductivity type at the first side;
   forming a drift region having the first conductivity type under the source region; and
   forming a well region separating the source region from the drift region, the well region having a second conductivity type opposite to the first conductivity type.

4. The method of claim 3, further comprising:
   implanting dopants into the bottom surface and activating the implanted dopants to form at least one of a drain region or a back side emitter after selectively removing the buried insulation region.

5. The method of claim 1, wherein forming the buried insulation region comprises forming a plurality of balloon shaped regions connected by thinner regions.

6. The method of claim 1, wherein forming the buried insulation region comprises:
   forming the plurality of openings in the semiconductor substrate by using an isotropic etching process.

7. The method of claim 6, wherein forming the plurality of openings comprises:
   forming a plurality of first openings using a first anisotropic etching process;
   forming a passivation layer at sidewalls and bottom surfaces of the plurality of first openings;
   forming a plurality of second openings in the semiconductor substrate using a second anisotropic etching process, wherein the second anisotropic etching process comprises etching through the passivation layer at the bottom surfaces of the plurality of first openings; and forming the plurality of openings by extending through the plurality of second openings using an isotropic etching process.

8. The method of claim 1, wherein forming the semiconductor layer comprises forming a first epitaxial layer.

9. The method of claim 8, wherein forming the first epitaxial layer comprises forming an epitaxial overgrowth layer using a lateral epitaxial overgrowth process, wherein the epitaxial overgrowth layer covers the buried insulation region.

10. The method of claim 9, further comprising:
forming a second epitaxial layer over the epitaxial overgrowth layer; and
forming the device regions in the second epitaxial layer.

11. The method of claim 10, wherein the device region comprises a source and a p-body region of a transistor.

12. The method of claim 1, wherein forming the semiconductor layer comprises:
depositing a semiconductor fill material; and
annealing the semiconductor layer and the substrate.

13. The method of claim 12, wherein the semiconductor fill material comprises an amorphous material.

14. The method of claim 12, wherein the semiconductor fill material comprises a polysilicon material.

15. The method of claim 1, further comprising planarizing the deposited semiconductor fill material.

16. The method of claim 1, wherein the semiconductor layer covers the buried insulation region.

* * * * *